(12) United States Patent
Kobayashi

(10) Patent No.: US 8,176,606 B2
(45) Date of Patent: May 15, 2012

(54) METHOD OF FABRICATING A PIEZOELECTRIC VIBRATING PIECE

(75) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 605 days.

(21) Appl. No.: 12/360,424

(22) Filed: Jan. 27, 2009

(65) Prior Publication Data

US 2009/0205178 A1 Aug. 20, 2009

(30) Foreign Application Priority Data

Feb. 14, 2008 (JP) ................................. 2008-033069

(51) Int. Cl.
*H04R 17/10* (2006.01)
*H01L 41/047* (2006.01)

(52) U.S. Cl. ............. 29/25.35; 29/846; 29/417; 29/842; 310/312; 310/365; 310/370

(58) Field of Classification Search ................. 29/25.35, 29/846, 412, 417, 842, 831; 310/311, 312, 310/365, 370
See application file for complete search history.

(56) References Cited

U.S. PATENT DOCUMENTS

| | | | | |
|---|---|---|---|---|
| 2,666,196 A | * | 1/1954 | Kinsley et al. | 310/370 X |
| 5,396,144 A | * | 3/1995 | Gupta et al. | 310/370 |
| 2005/0225199 A1 | * | 10/2005 | Satoh et al. | 310/312 |

FOREIGN PATENT DOCUMENTS

| | | | | |
|---|---|---|---|---|
| JP | 57011518 A | * | 1/1982 | .................. 29/25.35 |
| JP | 07-212161 | | 8/1995 | |
| JP | 2005134364 A | * | 5/2005 | |

OTHER PUBLICATIONS

Machine Language Translation of JP 2005-134364.*

* cited by examiner

*Primary Examiner* — A. Dexter Tugbang
(74) *Attorney, Agent, or Firm* — Brinks Hofer Gilson & Lione

(57) ABSTRACT

To carry out frequency adjustment easily, accurately and efficiently and achieve low cost formation and promotion of maintenance performance without being influenced by a size of a piezoelectric vibrating piece, there is provided a method of fabricating a piezoelectric vibrating piece which is a method of fabricating a piezoelectric vibrating pieces having a piezoelectric plate 11, a pair of exciting electrodes 12, 13, and a pair of mount electrodes electrodes 15, 16 by utilizing a wafer S, the method including an outer shape forming step of forming a frame portion S1 at the wafer and forming a plurality of piezoelectric plates to be connected to the frame portion by way of a connecting portion 11a, an electrode forming step of respectively forming pairs of exciting electrodes and pairs of mount electrodes to the plurality of piezoelectric plates and forming a plurality of pairs of extended electrodes S2, S3 to be respectively electrically connected to the pairs of mount electrodes by way of the connecting portion, a frequency adjusting step of adjusting a frequency of the piezoelectric plate while applying a drive voltage between the pair of the extended electrodes, and a cutting step of fragmenting the plurality of piezoelectric plates.

6 Claims, 20 Drawing Sheets

METHOD OF FABRICATING A PIEZOELECTRIC VIBRATING PIECE

RELATED APPLICATIONS

This application claims priority under 35 U.S.C. §119 to Japanese Patent Application No. JP2008-033069 filed on Feb. 14, 2008, the entire content of which is hereby incorporated by reference.

BACKGROUND OF THE INVENTION

1. Field of the Invention

The present invention relates to a method of fabricating a piezoelectric vibrating piece, a piezoelectric vibrating piece fabricated by the fabricating method, a wafer used for fabricating the piezoelectric vibrating piece, a piezoelectric vibrator having the piezoelectric vibrating piece, an oscillator, an electronic apparatus and a radiowave timepiece having the piezoelectric vibrating piece.

2. Description of the Related Art

In recent years, a portable telephone or a portable information terminal apparatus uses a piezoelectric vibrator utilizing quartz or the like as a time source, a timing source of a control signal or the like or a reference signal source or the like. As a piezoelectric vibrator of this kind, various ones are known, for example, a piezoelectric vibrator having a piezoelectric vibrating piece of a tuning fork type, a piezoelectric vibrator having a piezoelectric vibrating piece of carrying out a thickness slipping vibration and the like are known.

Explaining by taking an example of a piezoelectric vibrating piece of a tuning fork type, as shown by FIG. 22 and FIG. 23, a piezoelectric vibrating piece 201 includes a piezoelectric plate 212 having a pair of vibrating arm portions 210 arranged in parallel and a base portion 211 integrally fixing base end sides of the pair of vibrating arm portions 210, a pair of exciting electrodes 213 formed on outer surfaces of the pair of vibrating arm portions 210 for vibrating the pair of vibrating arm portions 210, and mount electrodes 214 respectively electrically connected to the pair of exciting electrodes 213. When a predetermined drive voltage is applied to the pair of exciting electrodes 213 by way of the pair of mount electrodes 214, the piezoelectric vibrating piece 201 is vibrated in directions of making the pair of vibrating arm portions 210 proximate to or remote from each other. Further, at this occasion, weights of weight metal films 215 coated to front ends of the vibrating arm portions 210 are previously adjusted (frequency adjustment) such that the pair of vibrating arm portions 210 are vibrated by a predetermined frequency.

It is general to fabricate a plurality of the piezoelectric vibrating pieces 201 of this kind at a time utilizing a wafer made of various piezoelectric materials of quartz, lithium tantalate, lithium niobate or the like (for example, JP-A-7-212161.

Specifically, as shown by FIG. 24, after constituting a wafer S by cutting a raw stone of a piezoelectric material, the wafer S is polished to a predetermined thickness. Further, the respective electrodes and the weight metal film 215 are formed by cleaning and drying the polished wafer S, forming an outer shape of the piezoelectric plate 212 by working the wafer S by etching by photolithography technology and patterning a predetermined metal film. Thereafter, a plurality of the piezoelectric vibrating pieces 201 can be fabricated at a time from the single wafer S by cutting to fragment the respective piezoelectric plates 212 from the wafer S.

Meanwhile, in a procedure of the fabrication, normally, a frequency adjustment (rough adjustment) of the piezoelectric plate 212 is carried out before fragmentation. Specifically explaining, first, the pair of vibrating arm portions 210 are oscillated by applying a drive voltage by contacting terminals of a frequency adjustor (for example, an oscillating circuit, a network analyzer or the like) respectively to the pair of mount electrodes 214. Further, the weight of the weight metal film 215 is adjusted by a trimming apparatus (for example, laser or the like) of the frequency adjustor while measuring a frequency at this occasion by the frequency adjustor. Thereby, the frequency adjustment can be carried out.

However, in the above-described method of fabricating the piezoelectric vibrating piece, the following problem remains.

First, in order to carry out the frequency adjustment of the piezoelectric plate, it is necessary to contact terminals of the frequency adjustor to both of the pair of mount electrodes. That is, it is necessary to contact the two terminals to the one piezoelectric plate. However, the pair of mount electrodes are formed in a state of being aligned in parallel on an outer surface of the piezoelectric plate having a size of a width by about several hundreds µm. Therefore, in order to accurately carry out the contact, it is necessary that the two terminals are made to be proximate to each other as much as possible, thereafter, the two terminals are positioned to the pair of mount electrodes. Therefore, the control of the terminal is difficult, the positioning is obliged to be carried out with care. Therefore, time is taken for adjusting the frequency and an efficient operation cannot be carried out.

Further, in recent years, the size of the piezoelectric vibrating piece is downsized, and also an interval of a pair of mount electrodes is narrowed. Therefore, the above-described problem becomes significant. Further, in accordance with the downsizing, also the mount electrode per se is downsized. Therefore, an area of contacting the terminal in adjusting the frequency becomes small, and it is difficult to contact the terminal. Therefore, also with regard to the point, control of the terminal becomes difficult, which effects an influence on an operational efficiency.

Further, in order to carry out the frequency adjustment as efficiently as possible, in a background art, there is also carried out a method of carrying out the frequency measurement on a plurality of the piezoelectric plates by not adjusting the piezoelectric plates one by one but by contacting the two terminals simultaneously to the plurality of piezoelectric plates. For example, there is provided a method of dividing the plurality of piezoelectric plates connected to the wafer by a unit of a row and measuring frequencies for the respective divided rows. Thereby, the operational efficiency can be increased, however, on the contrary, it is necessary to increase a number of the terminals of the frequency adjustors twice as much as a number of the piezoelectric plates vibrated simultaneously. Therefore, it is necessary to prepare a number of the terminals beforehand, and a reduction in cost is difficult to achieve. Further, the control of the terminals is difficult even in contacting the two terminals accurately to the one piezoelectric plate as described above. In contrast thereto, when the frequency adjustment is carried out simultaneously, it is necessary to simultaneously and accurately contact a number of the terminals to the mount electrodes of the plurality of piezoelectric plates, and therefore, a further difficult operation is constituted.

In addition thereto, when downsizing the size of the piezoelectric vibrating piece is aimed at as described, the interval between the contiguous piezoelectric plates is further narrowed. Therefore, there is brought about a situation in which contacting the respective two terminals to the plurality of piezoelectric plates per se becomes severe.

Further, as the terminals of the frequency adjustor increases, a number of steps consumed in maintenance of the terminals is needed. Therefore, although the frequency adjusting operation can efficiently be carried out by simultaneously carrying out the frequency measurement for the plurality of piezoelectric plates, on the contrary, a deterioration in maintenance performance is brought about.

SUMMARY OF THE INVENTION

The invention has been carried out in view of the above-described situation and it is an object thereof to provide a method of fabricating a piezoelectric vibrating piece capable of easily, accurately, and efficiently carrying out frequency adjustment without being influenced by a size of the piezoelectric vibrating piece and capable of achieving low cost formation and promotion of maintenance performance, a piezoelectric vibrating piece fabricated by the fabricating method and a wafer for fabricating the piezoelectric vibrating piece.

Further, it is an object thereof to provide a piezoelectric vibrator, an oscillator, an electronic apparatus and a radio-wave timepiece having the piezoelectric vibrator.

The invention provides the following means in order to resolve the problem.

A method of fabricating a piezoelectric vibrating piece according to the invention is a method of fabricating a plurality of piezoelectric vibrating pieces each including a piezoelectric plate, a pair of exciting electrodes formed on an outer surface of the piezoelectric plate for vibrating the piezoelectric plate when a predetermined drive voltage is applied thereto, and a pair of mount electrodes formed in a state of being aligned in parallel by constituting a predetermined interval along a width direction of the piezoelectric plate and electrically connected respectively to the pair of exciting electrodes at a time utilizing a wafer made of a piezoelectric material, the method comprising an outer shape forming step of forming a frame portion and forming to connect the plurality of piezoelectric plates to the frame portion in a cantilever shape by way of a connecting portion in a state of directing base end sides thereof to the frame portion by etching the wafer by a photolithography technology, an electrode forming step of respectively forming the pairs of exciting electrodes and the pairs of mount electrodes to the plurality of piezoelectric plates and forming a plurality of pairs of extended electrodes to be electrically connected to respectively to the pairs of mount electrodes by way of the connecting portion on the frame portion by patterning an electrode film on the wafer, a frequency adjusting step of adjusting a frequency of the piezoelectric plate while vibrating the piezoelectric plate by applying the drive voltage between the pair of the extended electrodes, and a cutting step of fragmenting the plurality of piezoelectric plates by cutting the connecting portion.

Further, a piezoelectric vibrating piece according to the invention is a piezoelectric vibrating piece fabricated by cutting a connecting portion from a state of being connected to a wafer in a cantilever shape by way of the connecting portion, the piezoelectric vibrating piece comprising a piezoelectric plate a base end side of which is connected to the connecting portion, a pair of exciting electrodes formed on an outer surface of the piezoelectric plate for vibrating the piezoelectric plate when a predetermined drive voltage is applied thereto, and a pair of mount electrodes formed at the base end side of the piezoelectric plate in a state of being aligned in parallel by constituting a predetermined interval along a width direction of the piezoelectric plate and respectively electrically connected to the pair of exciting electrodes, wherein the pair of mount electrodes are respectively formed to be brought into contact with an edge end on the base end side of the piezoelectric plate and extended to the connecting portion at a time point before being cut.

According to the method of fabricating a piezoelectric vibrating piece and the piezoelectric vibrating piece according to the invention, first, there is carried out the outer shape forming step of forming the frame portion and forming the plurality of piezoelectric plates to be connected to the frame portion by etching the wafer made of the piezoelectric material of quartz or the like by the photolithography technology. At this occasion, etching is carried out such that the plurality of piezoelectric plates are connected thereto in a cantilever shape by way of a connecting portion in a state of directing the base end sides to the frame portion. Successively, there is carried out the electrode forming step of forming the pair of exciting electrodes and the pair of mount electrodes respectively to the plurality of piezoelectric plates and forming the plurality of pairs of extended electrodes on the frame portion by patterning the electrode film on the wafer. At this occasion, the pairs of extended electrodes are formed to be respectively electrically connected to the pairs of mount electrodes by way of the connecting portion.

Successively, there is carried out the frequency adjusting step of adjusting the frequency of the piezoelectric plate while vibrating the piezoelectric plate by applying the drive voltage between the pair of the extended electrodes, successively, there is carried out the cutting step of cutting to separate the plurality of piezoelectric plates from the frame portion to fragment by cutting the connecting portion. Thereby, the plurality of piezoelectric vibrating pieces formed with the pairs of exciting electrodes and the pairs of mount electrodes on the outer surface of the piezoelectric plates can be fabricated at a time from the single wafer. Further, the connecting portion is cut by the cutting step, and also the pair of mount electrodes respectively connected to the pair of the extended electrodes by way of the connecting portion are simultaneously cut to separate. Therefore, the pair of mount electrodes are constituted by the shape of being formed to be brought into contact with the edge end of the base end side of the piezoelectric plate respectively.

Particularly, when the frequency adjusting step is carried out, different from the background art, the piezoelectric plate can be vibrated by applying the drive voltage by contacting terminals of a frequency adjustor respectively between the pair of the extended electrodes formed above the frame portion. In the case of the background art, it is necessary to contact the terminals to both of the pair of mount electrodes on the piezoelectric plate. That is, it is necessary to contact the two terminals to the one piezoelectric plate. Therefore, in order to carry out the contact accurately, it is necessary to accurately position the two terminals to the pair of mount electrodes in a state of making the two terminals as proximate as possible thereto.

In contrast thereto, in the case of the invention, the terminals may be contacted to both of the pair of the extended electrodes on the frame portion. A size of the frame portion formed with the pair of the extended electrodes is not restricted as in the piezoelectric plate formed with the pair of mount electrodes. Therefore, an interval between the electrodes of the pair of the extended electrodes can be ensured to be larger than that of the pair of mount electrodes. Therefore, when the terminals are contacted to the pair of the extended electrodes, it is not necessary to make the two terminals proximate to each other as in the background art. Therefore, the control of the terminal can easily be carried out, and the frequency adjustment can further speedily and accurately be carried out. Further, the efficient operation can be carried out.

Further, even when, assumedly, the pair of mount electrodes per se are reduced such that the terminals are difficult to be contacted thereto in accordance with further small-sized formation, the terminals may be contacted to the extended electrodes, and therefore, the terminals are not influenced by the size of the piezoelectric vibrating piece. Thereby, the frequency adjustment can firmly be carried out without being influenced by the size of the piezoelectric vibrating piece.

Further, in the method of fabricating a piezoelectric vibrating piece according to the invention, in the electrode forming step, the pair of extended electrodes are formed in a state of being aligned in parallel by constituting the intervals along the width direction, and formed such that a length of a total thereof along the width direction becomes longer than a length of a total of the pair of mount electrodes along the direction.

In the method of fabricating a piezoelectric vibrating piece according to the invention, in the electrode forming step, the pair of the extended electrodes are formed in the state of being aligned in parallel by constituting the interval the same as that between the pair of mount electrodes along the width direction of the piezoelectric plate, and formed such that the length of the total along the width direction becomes longer than the length of the total of the pair of mount electrodes along the same direction. Therefore, when the terminals are contacted to the pair of the extended electrodes in the frequency adjusting step, the contact can be carried out by widening the interval between the terminals in the direction the same as the direction of aligning the pair of mount electrodes. Therefore, the control for widening the interval between the terminals can easily be carried out. Thereby, the frequency adjustment can be carried out further speedily and accurately.

Further, in the method of fabricating a piezoelectric vibrating piece according to the invention, in the electrode forming step, a common extended electrode is formed by respectively electrically connecting a plurality of the extended electrodes on one side.

In the method of fabricating the piezoelectric vibrating piece according to the invention, in the electrode forming step, the common extended electrode is formed by electrically connecting respectively with the plurality of the extended electrodes on one side. That is, the common extended electrode is formed in a state of being conducted to all of the mount electrodes on one side respectively formed on the plurality of piezoelectric plates connected to the frame portion. Therefore, in carrying out the frequency adjusting step, the piezoelectric plate can be vibrated by applying the drive voltage by contacting the terminals of the frequency adjustor respectively to the common extended electrode and the extended electrode on other side on the frame portion in carrying out the frequency adjusting step. Therefore, it is not necessary to make the two terminals proximate to each other. Further, the terminal contacted to the common extended electrode may be contacted to a predetermined position previously set on the common extended electrode without depending on a position of the piezoelectric plate to be vibrated. Therefore, the control of the terminal can further easily be carried out and the frequency adjustment can further speedily and accurately be carried out.

Further, in the method of fabricating a piezoelectric vibrating piece according to the invention, in the frequency adjusting step, the frequency of the piezoelectric plate is adjusted while vibrating simultaneously a plurality of the piezoelectric plates by applying the drive voltage between the common extended electrode and a plurality of the extended electrodes on other side.

In the method of fabricating the piezoelectric vibrating piece according to the invention, in the frequency adjusting step, the frequency of the piezoelectric plates is adjusted by simultaneously vibrating the plurality of piezoelectric plates by applying the drive voltage by contacting the terminals to the common extended electrode and the plurality of the extended electrodes on other side without vibrating the piezoelectric plates one by one. Thereby, the frequency adjustment can further efficiently be carried out and the fabrication efficiency can be promoted.

Meanwhile, in the background art, when the plurality of piezoelectric plates are simultaneously vibrated, it is necessary to contact the terminals respectively to the pairs of mount electrodes of the respective piezoelectric plates, and therefore, a number of the terminals is needed to be twice as much as a number of the piezoelectric plates.

In contrast thereto, the common extended electrode is utilized, and therefore, the terminals may be contacted to the common extended electrode and the plurality of extended electrodes on other side. Therefore, the number of the terminals is not a number twice as much as the number of the piezoelectric plates to be vibrated but may be a number adding the number of the piezoelectric plates to be vibrated and one for the common extended electrode. Therefore, the number of terminals can considerably be reduced in comparison with that of the background art, and a reduction in cost can be achieved. Further, the number of terminals can considerably be reduced, further, the one terminal may be contacted to the one piezoelectric plate, and therefore, the control of the terminal becomes easy invariably. Therefore, even when the frequency adjustment is carried out simultaneously in the plurality of the piezoelectric plates, the frequency adjustment can easily and accurately be carried out.

Further, even when an interval of the piezoelectric plates contiguous to each other becomes narrow, assumedly by achieving further small-sized formation, only the one terminal may be contacted to the one piezoelectric plate, and therefore, the contact can be carried out easily. Therefore, the frequency adjustment can firmly be carried out without being influenced by the size of the piezoelectric vibrating piece.

In addition thereto, the number of terminals can considerably be reduced, and therefore, a number of steps consumed in maintenance of the terminal can be reduce. Thereby, promotion of maintenance performance can be achieved.

Further, a wafer according to the invention is a wafer to which a plurality of piezoelectric vibrating pieces each including a piezoelectric plate, a pair of exciting electrodes formed on an outer surface of the piezoelectric plate for vibrating the piezoelectric plate when a predetermined drive voltage is applied thereto, and a pair of mount electrodes formed at a base end side of the piezoelectric plate in a state of being aligned in parallel by constituting a predetermined interval along a width direction of the piezoelectric plate and respectively electrically connected to the pair of exciting electrodes are connected, wherein the piezoelectric plate comprises a frame portion connected in a cantilever shape by way of a connecting portion in a state of directing a base end side, and a plurality of pairs of extended electrodes formed to be respectively electrically connected to the pairs of mount electrodes by way of the connecting portion on the frame portion.

In the wafer according to the invention, the frequency of the piezoelectric plate can be adjusted while vibrating the piezoelectric plate by applying the drive voltage between the pair of the extended electrodes. At this occasion, by utilizing the pair of the extended electrodes, the frequency adjustment can easily, accurately and efficiently be carried out without being influenced by the size of the piezoelectric vibrating piece.

Further, the plurality of piezoelectric vibrating pieces can be fabricated at a time by fragmenting the plurality of piezoelectric plates by cutting the connecting portion of the wafer in which the frequency of the piezoelectric plates is adjusted by the above-described method. According to the piezoelectric vibrating piece, high quality formation and low cost formation can be achieved.

Further, in a wafer according to the invention, the pair of extended electrodes are formed in a state of being aligned in parallel by constituting the interval along the width direction becomes longer than a length of a total of the pair of mount electrodes along the same direction.

In the wafer according to the invention, the frequency adjustment can further easily be carried out by adjusting the frequency of the piezoelectric plate by vibrating the piezoelectric plate by applying the drive voltage between the pair of the extended electrodes.

Further, the wafer according to the invention further comprises a common extended electrode formed by electrically connecting respectively the plurality of extended electrodes on one side.

In the wafer according to the invention, the frequency of the piezoelectric plate can be adjusted while vibrating the piezoelectric plate by applying the drive voltage between the common extended electrode and the extended electrode on other side. At this occasion, the frequency adjustment can further easily and efficiently be carried out by utilizing the common extended electrode. Further, when the frequencies of the plurality of piezoelectric plates are simultaneously adjusted, low cost formation and promotion of maintenance can be achieved in comparison with the background art.

Further, a piezoelectric vibrator according to the invention comprises the piezoelectric vibrating piece according to the invention.

In the piezoelectric vibrator according to the invention, the above-described piezoelectric vibrating piece is provided, and therefore, the predetermined frequency can be ensured and high quality formation and low cost formation of the piezoelectric vibrator can be achieved.

Further, in an oscillator according to the invention, the piezoelectric vibrator of the invention is electrically connected to an integrated circuit as an oscillating piece.

Further, in an electronic apparatus according to the invention, the piezoelectric vibrator according to the invention is electrically connected to a time counting portion.

Further, in a radiowave timepiece according to the invention, the piezoelectric vibrator of the invention is electrically connected to a filter portion.

In the oscillator, the electronic apparatus and the radiowave timepiece according to the invention, the piezoelectric vibrator mentioned above is provided, and therefore, high quality formation and low cost formation of the can be achieved similar to the piezoelectric vibrator.

According to the method of fabricating the piezoelectric vibrating piece of the invention, the frequency adjustment can easily, accurately and efficiently be carried out without being influenced by the size of the piezoelectric vibrating piece and low cost formation and promotion of maintenance performance can be achieved.

Further, according to the piezoelectric vibrating piece according to the invention, the piezoelectric vibrating piece is fabricated by the above-described method of fabricating the piezoelectric vibrating piece, the frequency adjustment is carried out easily and accurately and efficiently, and therefore, high quality formation and low cost formation can be achieved.

Further, according to the wafer of the invention, the above-described piezoelectric vibrating piece can efficiently be fabricated at a time and low cost formation can be achieved.

Further, according to the piezoelectric vibrator, the oscillator, the electronic apparatus and the radiowave timepiece of the invention, the above-described piezoelectric vibrating piece is provided, and therefore, high quality formation and low cost formation can be achieved.

DETAILED DESCRIPTION OF THE PREFERRED EMBODIMENTS

First Embodiment

A first embodiment according to the invention will be explained in reference to FIG. 1 through FIG. 11 as follows. Further, according to the embodiment, as a piezoelectric vibrator 1, an explanation will be given by taking an example of a piezoelectric vibrator of a cylinder package type.

Figure 1:
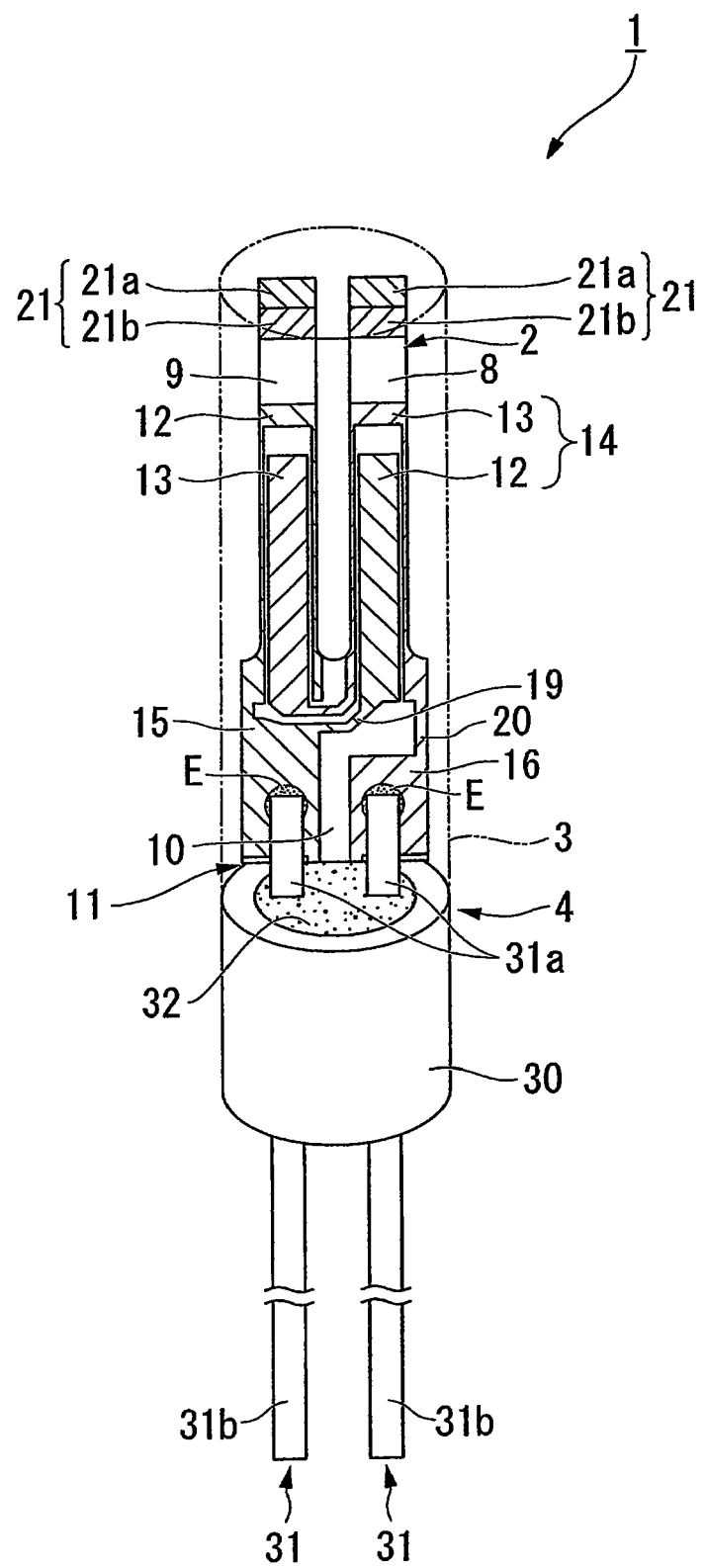
FIG. 1 is a view viewing a content of a case of a piezoelectric vibrator of a first embodiment according to the invention and is a view of a state of planely viewing a piezoelectric vibrating piece.
Figure 2:
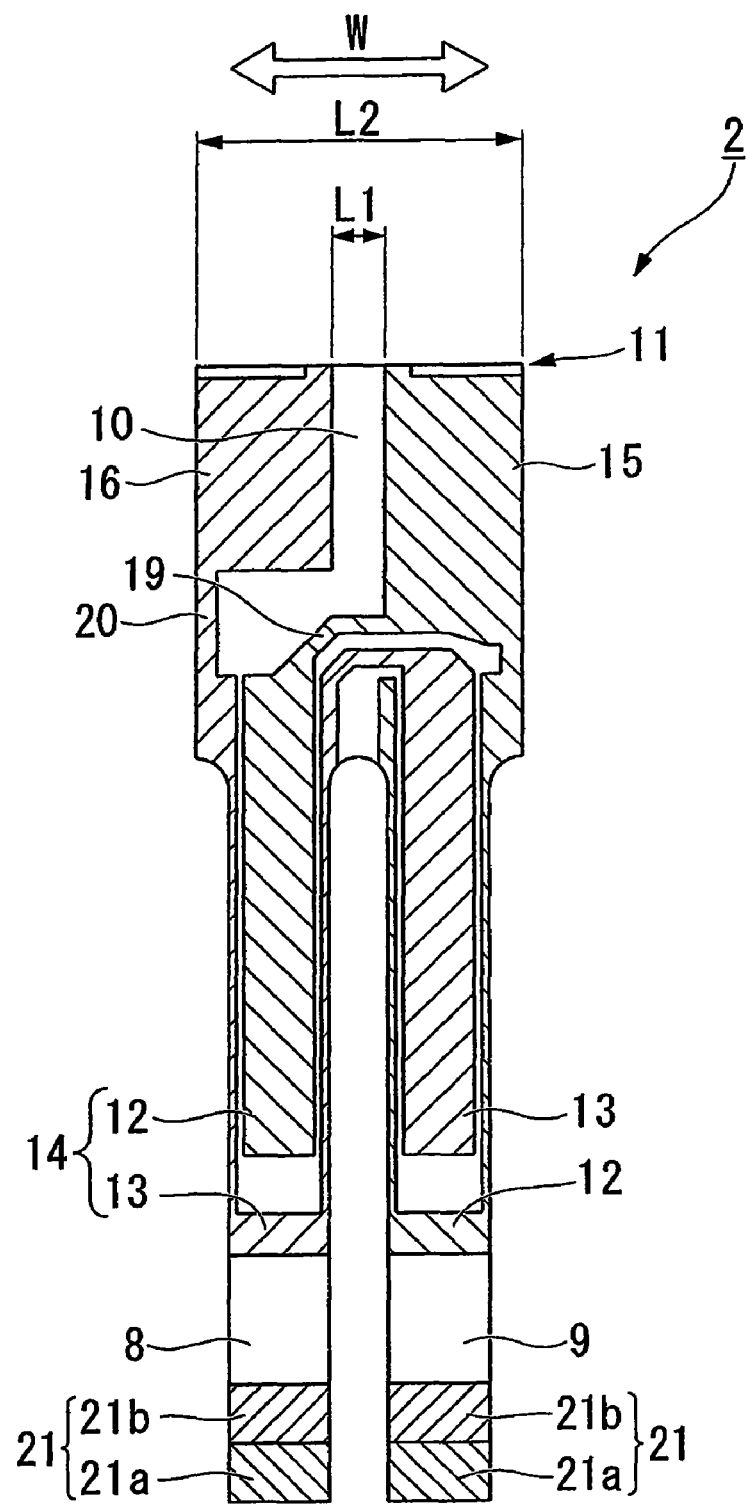
FIG. 2 is a view viewing the piezoelectric vibrating piece shown in FIG. 1 from an upper face.
Figure 3:
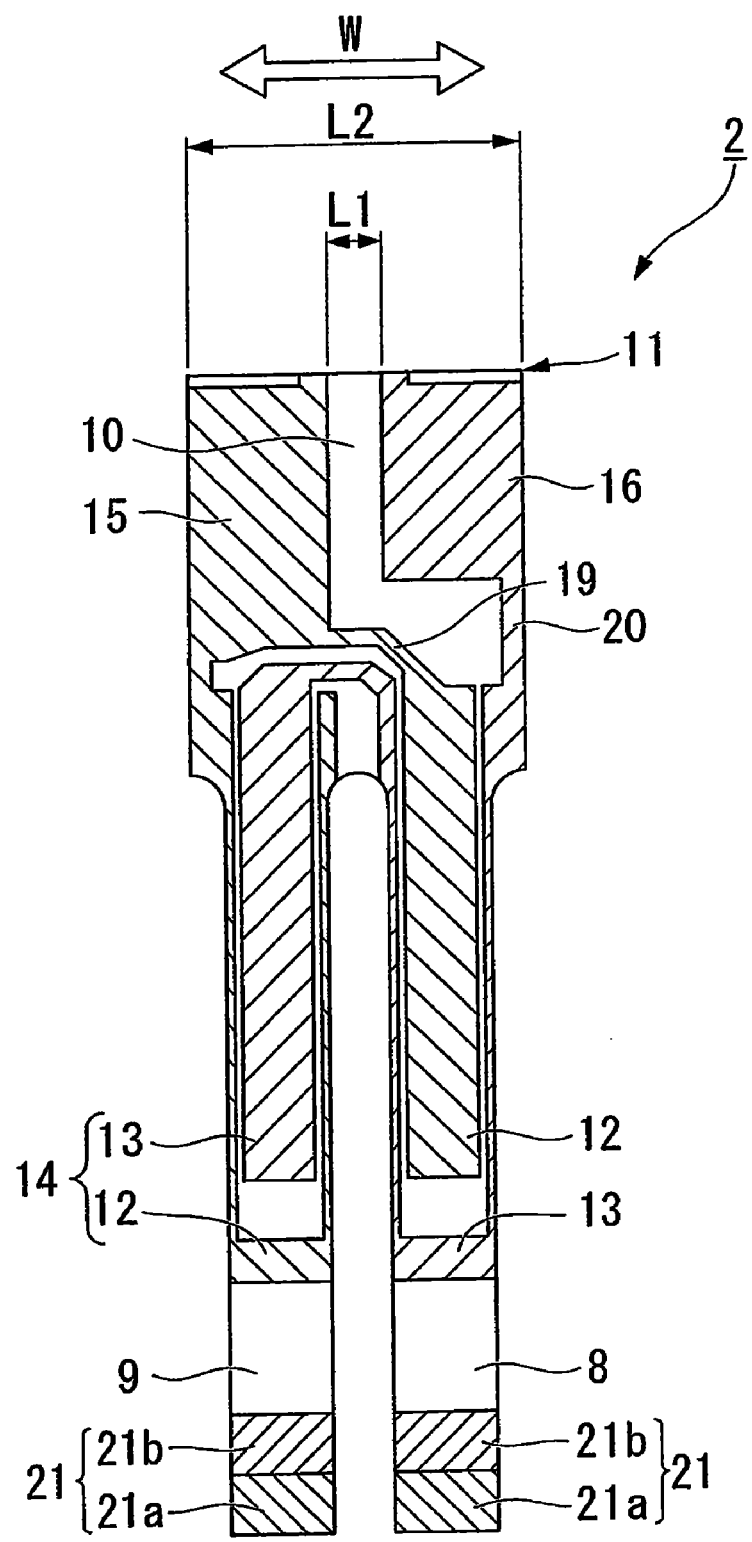
FIG. 3 is a view viewing the piezoelectric vibrating piece shown in FIG. 1 from a lower face.

As shown by FIG. 1 through FIG. 3, the piezoelectric vibrator 1 of the embodiment includes a piezoelectric vibrating piece 2, a case 3 of containing the piezoelectric vibrating piece 2 at inside thereof, and a plug 4 constituting an airtight terminal of hermetically closing the piezoelectric vibrating piece 2 at inside of the case 3.

As shown by FIG. 2 and FIG. 3, the piezoelectric vibrating piece 2 is a vibrating piece of a tuning fork type formed by a piezoelectric material of quartz, lithium tantalate, lithium niobate or the like and is vibrated when a predetermined voltage is applied thereto.

The piezoelectric vibrating piece 2 includes a piezoelectric plate 11 having a pair of vibrating arm portions 8, 9 arranged in parallel and a base portion 10 integrally fixing base end sides of the pair of vibrating arm portions 8, 9, a pair of exciting electrodes 14 constituted by a first exciting electrode 12 and a second exciting electrode 13 formed on outer surfaces of the pair of vibrating arm portions 8, 9 for vibrating the pair of vibrating arm portions 8, 9, and mount electrodes 15, 16 electrically connected to the first exciting electrode 12 and the second exciting electrode 13.

The pair of exciting electrodes 14 constituted by the first exciting electrode 12 and the second exciting electrode 13 are electrodes of vibrating the pair of vibrating arm portions 8, 9 in a direction of being proximate to or remote from each other by a predetermined resonance frequency, and are formed by being patterned on the outer surfaces of the pair of vibrating arm portions 8, 9 in a state of being electrically cut to separate respectively. Specifically, the first exciting electrode 12 is mainly formed on the one vibrating arm portion 8 and on two side faces of the other vibrating arm portion 9, and the second exciting electrode 13 is mainly formed on two side faces of the one vibrating arm portion 8 and on the other vibrating arm portion 9.

Further, the first exciting electrode 12 and the second exciting electrode 13 are electrically connected to the mount electrodes 15, 16 by way of lead out electrodes 19, 20 respectively on two main faces of the base portion 10. The mount electrodes 15, 16 are formed in a state of being aligned in parallel by being spaced apart from each other by a predetermined interval L1 along a width direction W of the piezoelectric plate 11. Further, the pair of mount electrodes 15, 16 are respectively formed to be brought into contact with an edge portion on the base end side of the piezoelectric plate 11. Further, a length of a total of the pair of mount electrodes 15, 16 along the width direction W is designated by notation L2.

Further, the piezoelectric vibrating piece 2 is applied with a voltage by way of the mount electrodes 15, 16.

Further, front ends of the pair of vibrating arm portions 8, 9 are coated with weight metal films 21 for carrying out adjustment (frequency adjustment) of vibrating states of their own to vibrate within a range of a predetermined frequency. Further, the weight metal film 21 is divided into a rough adjusting film 21a used in adjusting roughly a frequency and a fine adjusting film 21b used in adjusting the frequency finely. By carrying out the frequency adjustment by utilizing the rough adjusting film 21a and the fine adjusting film 21b, the frequency of the pair of vibrating arm portions 8, 9 can be confined to within a range of a nominal frequency of a device.

As shown by FIG. 1, the case 3 is formed in a shape of a bottomed cylinder, press-fit to an outer periphery of a stem 30 mentioned later of the plug 4 in a state of containing the piezoelectric vibrating piece 2 at inside thereof to be fitted to be fixed. Further, the case 3 is press-fit in a vacuum atmosphere, and the space surrounding the piezoelectric vibrating piece 2 at inside of the case 3 is brought into a state of being maintained in vacuum.

The plug 4 includes the stem 30 of hermetically closing the case 3, 2 pieces of lead terminals 31 one end sides of which are made to constitute inner leads 31a of mounting (mechanically bonding and electrically connecting) the piezoelectric vibrating piece 2 arranged in parallel to penetrate the stem 30 by interposing the stem 30 and other end sides of which are made to constitute outer leads 31b of being electrically connected to outside, and an insulating film member 32 filled on an inner side of the stem 30 for fixing the stem 30 and the lead terminal 31.

The stem 30 is formed in a ring-like shape by a metal material. Further, a material of the filling member 32 is, for example, borosilicate glass. Further, a surface of the lead terminal 31 and an outer periphery of the stem 30 are applied with platings, not illustrated, respectively of the same material.

Portions of 2 pieces of the lead terminals 31 projected to inside of the case 3 are made to constitute the inner leads 31a and portions thereof projected to outside of the case 3 are made to constitute the outer leads 31b. Further, the inner leads 31a and the mount electrodes 15, 16 are mounted by way of conductive bumps E. That is, the inner leads 31a and the mount electrodes 15, 16 are mechanically bonded, simultaneously, electrically connected by way of the bumps E. As a result, the piezoelectric vibrating piece 2 is brought into a state of being mounted to 2 pieces of the lead terminals 31.

Further, according to 2 pieces of the lead terminals 31 mentioned above, the one end sides (sides of outer leads 31b) are electrically connected to outside and the other end sides (sides of inner leads 31a) are made to function as external portion connecting terminals mounted to the piezoelectric vibrating piece 2.

Here, examples of dimensions and materials of main parts constituting the plug 4 will be described.

A diameter of the lead terminal 31 is about 0.12 mm, and kovar (FeNiCo alloy) is commonly used as a material of a base member of the lead terminal 31. Further, as a material of a plating coated on an outer surface of the lead terminal 31 and the outer periphery of the stem 30, Cu is used as a matrix film, and as a finish film, a heat resistant solder plating (alloy of tin and lead, a weight ratio thereof is 1:9), silver (Ag), tin copper alloy (SnCu), gold tin alloy (AuSn) or the like is used.

Further, inside of the case 3 can be sealed in airtight in a vacuum state by subjecting an inner periphery of the case 3 to cold pressure welding in vacuum while interposing a metal film (plating layer) coated to the outer periphery of the stem 30.

When the piezoelectric vibrator 1 constituted in this way is operated, a predetermined drive voltage is applied to the outer leads 31b of 2 pieces of the lead terminals 31. Thereby, a current can be made to flow to the pair of exciting electrodes 14 constituted by the first exciting electrode 12 and the second exciting electrode 13 by way of the inner leads 31a, the bumps E, the mount electrodes 15, 16 and the lead out electrodes 19, 20, and the pair of vibrating arm portions 8, 9 can be vibrated in directions of being proximate to and remote from each other by the predetermined frequency. Further, by utilizing the vibration of the pair of vibrating arm portions 8, 9, the vibration can be utilized as a timing source, a reference signal source or the like of a time source, a control signal.

Figure 4:
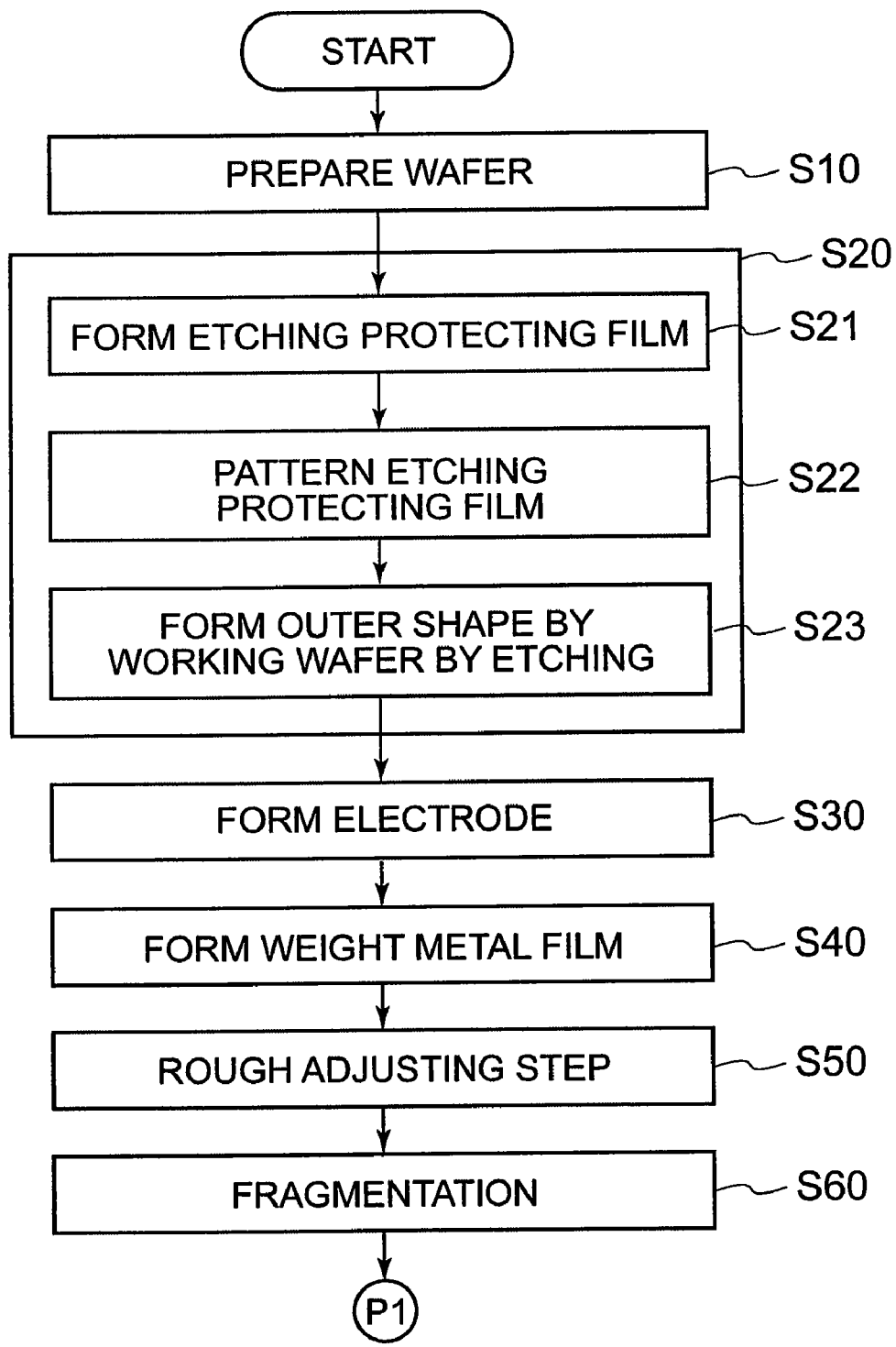
FIG. 4 is a flowchart in fabricating the piezoelectric vibrator shown in FIG. 1.
Figure 5:
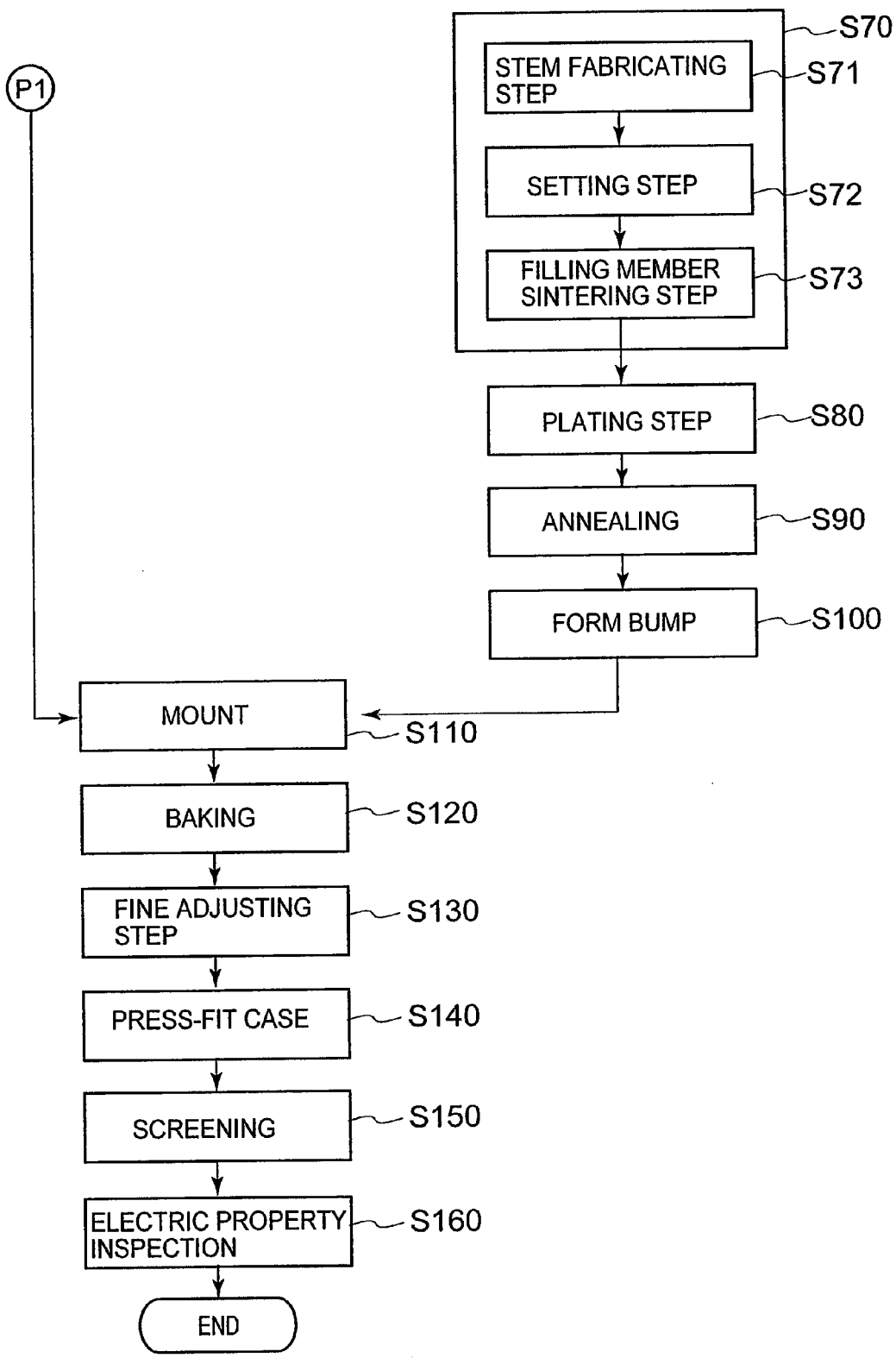
FIG. 5 is a continuation of the flowchart shown in FIG. 4.

Next, a fabricating method of fabricating a plurality of the piezoelectric vibrator 1 at a time will be explained in reference to a flowchart shown in FIG. 4 and FIG. 5.

Specifically, first, Lambert raw stone of quartz is sliced by a predetermined angle to constitute a wafer S having a constant thickness. Successively, the wafer is roughly worked by lapping, thereafter, a work denatured layer is removed by etching, thereafter, mirror face polishing of polishing or the like is carried out to constitute the wafer S having the predetermined thickness (S10).

Figure 6:
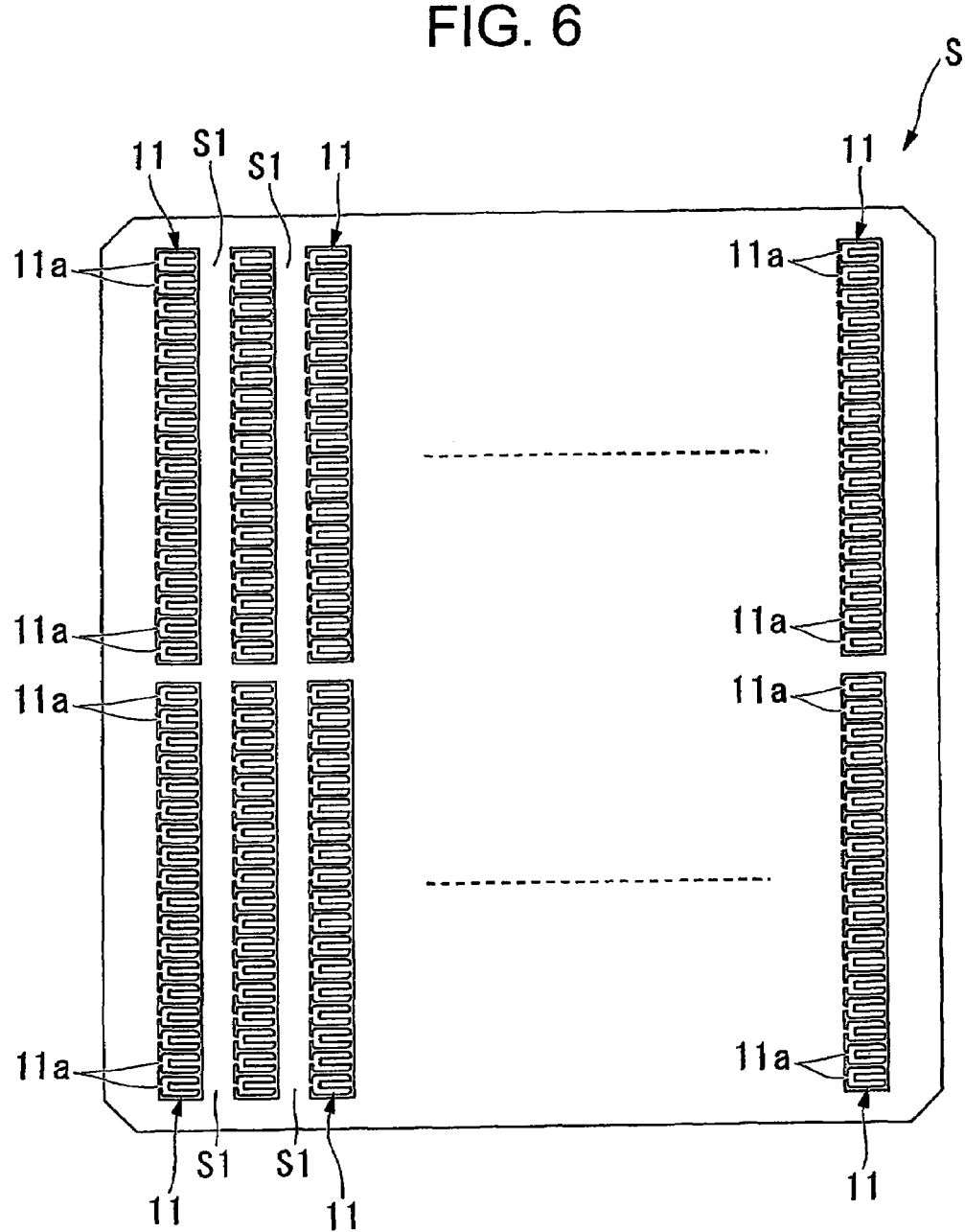
FIG. 6 is a view showing one step in fabricating the piezoelectric vibrator shown in FIG. 1 and is a view showing a state of a wafer after finishing an outer shape forming step.

Next, there is carried out an outer shape forming step of etching the wafer S as polished by a photolithography technology, as shown by FIG. 6, forming a frame portion S1 and forming a plurality of the piezoelectric plates 11 to be connected to the frame portions S1 (S20). At this occasion, the plurality of piezoelectric plates 11 are etched to connect in a cantilever shape by way of connecting portion 11a in a state of directing the base end sides to the frame portions S1. In the following, a procedure until forming the wafer S as shown by FIG. 6 from the wafer S as polished will specifically be explained.

Figure 7:
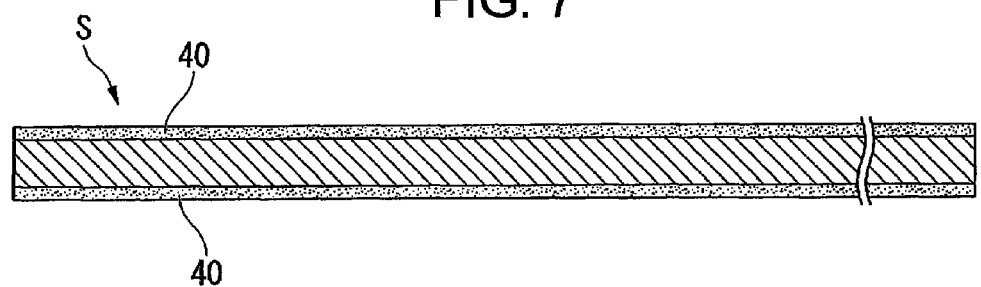
FIG. 7 is a view showing one step in fabricating the piezoelectric vibrator shown in FIG. 1 and is a view showing a state of forming etching protecting films on both faces of the wafer.
Figure 8:
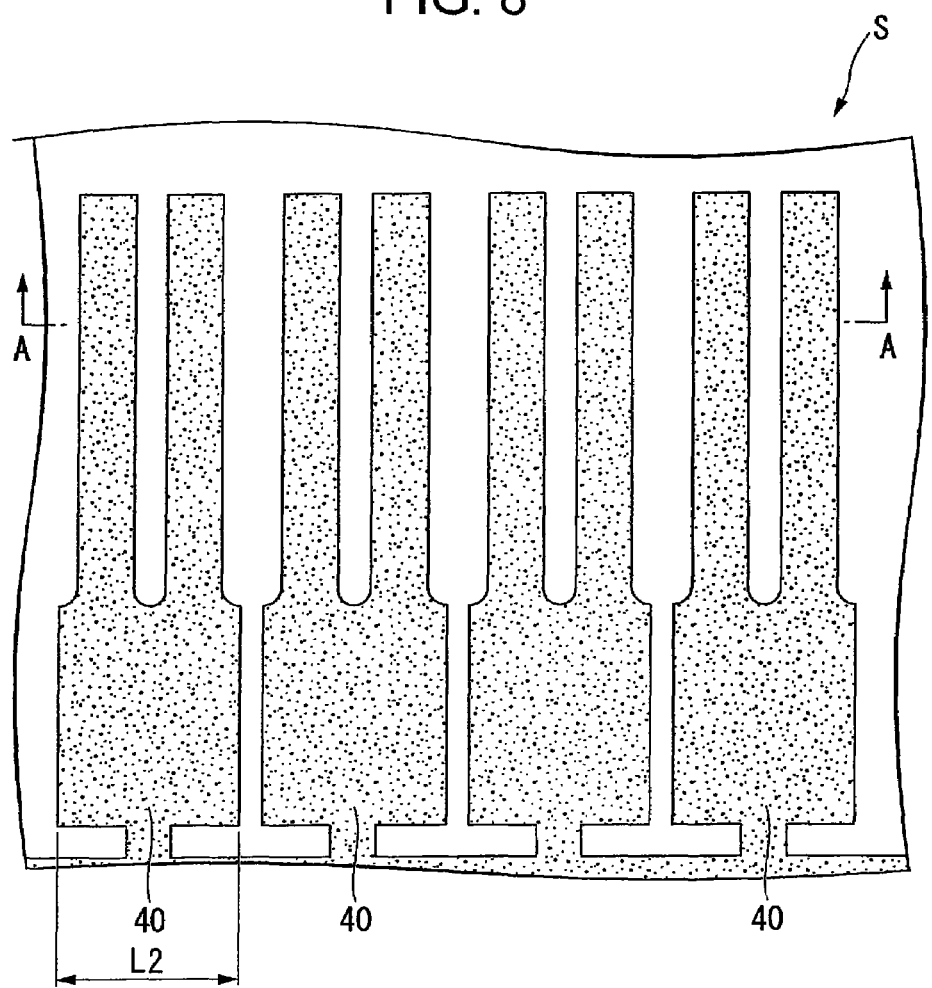
FIG. 8 is a view showing a state of patterning the etching protecting film to an outer shape of a piezoelectric plate of a piezoelectric vibrating piece from the state shown in FIG. 7.
Figure 9:
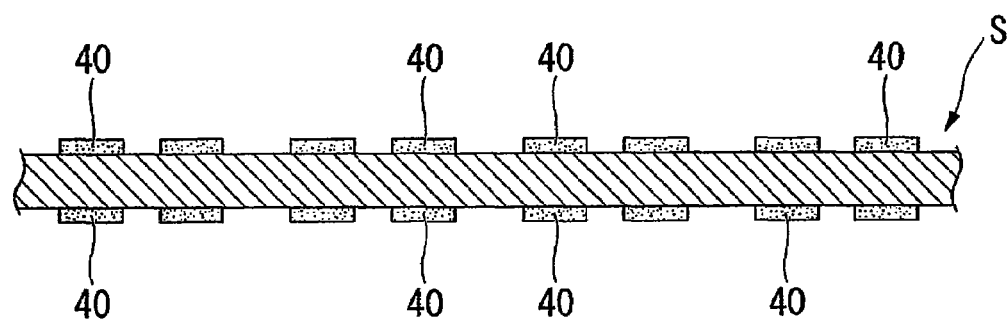
FIG. 9 is a sectional view taken along a line A-A shown in FIG. 8.
Figure 10:
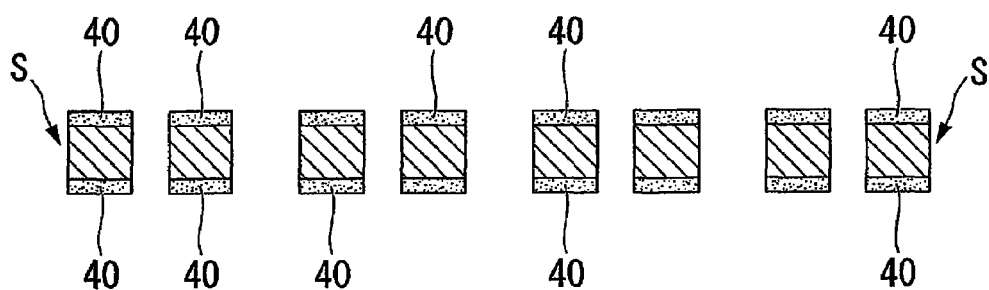
FIG. 10 is a view showing a state of working the wafer by etching by constituting a mask by the etching protecting film from the state shown in FIG. 9.
Figure 11:
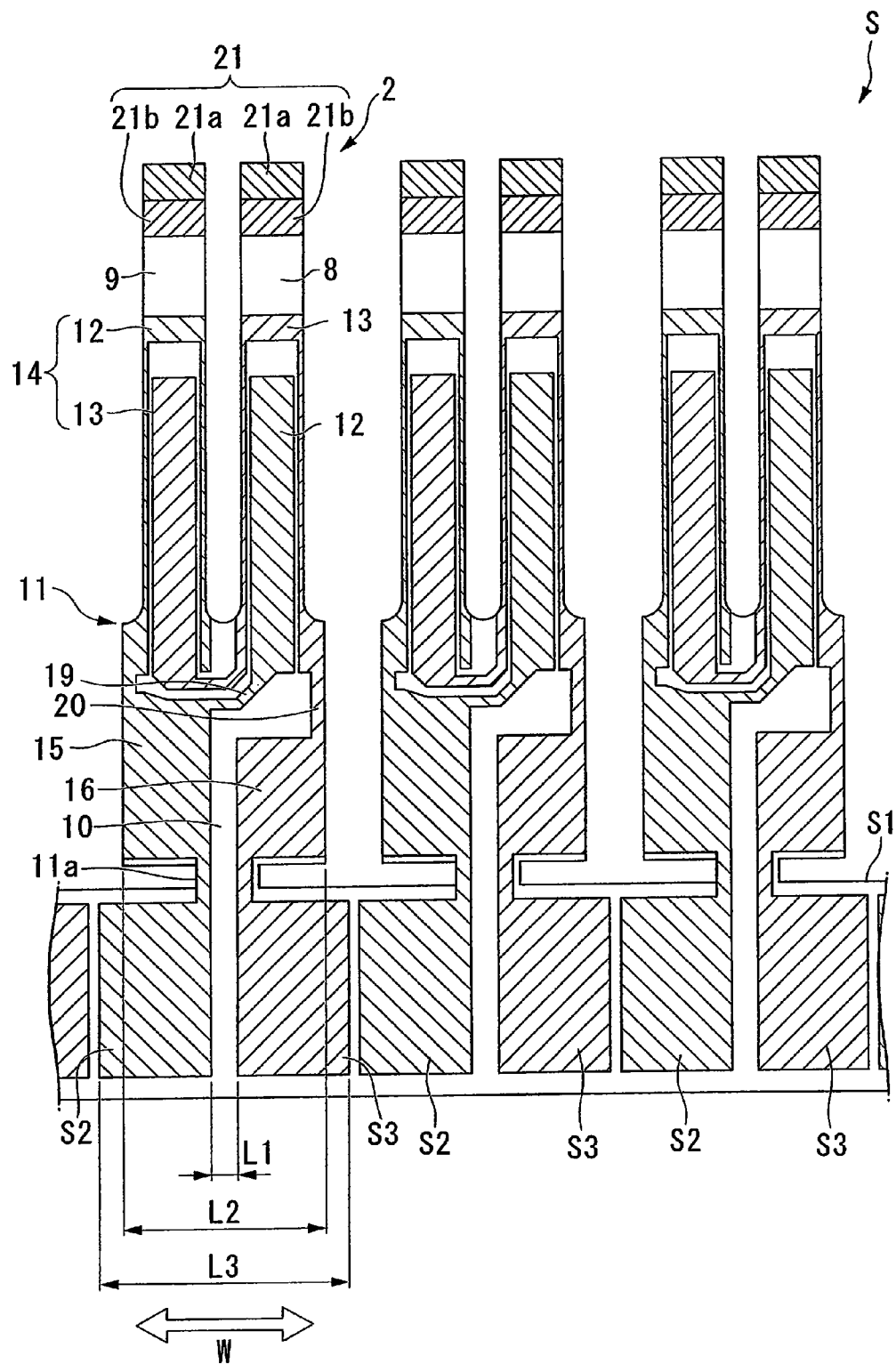
FIG. 11 is a view showing a state of forming an electrode film and a weight metal film on the wafer from the state shown in FIG. 10 and is a view enlarging an upper face of the wafer.

First, after preparing the wafer S finished with polishing, as shown by FIG. 7, etching protecting films 40 are respectively formed on both faces of the wafer S (S21). As the etching protecting film 40, for example, chromium (Cr) is formed by several μm. Next, a photoresist film, not illustrated, is patterned on the etching protecting film 40 by a photolithography technology. At this occasion, the patterning is carried out to surround surroundings of the frame portion S1, the piezoelectric plate 11 and the connecting portion 11a. Further, etching is carried out by constituting a mask by the photoresist film to selectively remove the etching protecting film 40 which is not masked. Further, the photoresist film is removed after etching. Thereby, as shown by FIG. 8 and FIG. 9, the etching protecting films 40 can be patterned in the above-described shape (S22). That is, the plurality of piezoelectric plates 11 can be patterned in the shape of being connected in the cantilever shape by way of the connecting portion 11a in the state of directing the base end sides to the frame portion S1. Further, at this occasion, the patterning is carried out by a number of the plurality of piezoelectric plates 11. Further, FIG. 9 and FIG. 10 are views showing sections along a cut line A-A shown in FIG. 8.

Next, both faces of the wafer S are respectively etched by constituting a mask by the patterned etching protecting film 40 (S23). Thereby, as shown by FIG. 6 and FIG. 10, the frame portion S1 is formed by selectively removing a region of the etching protecting film 40 which is not masked and can be formed to connect the plurality of piezoelectric plates 11 to the frame portions S1. At the time point, an outer shape forming step is finished.

Next, there is carried out an electrode forming step of respectively forming the pairs of exciting electrodes 14, the pairs of mount electrodes 15, 16 and the lead out electrodes 19, 20 to the plurality of piezoelectric plates 11 and forming the pair of extended electrodes S2, S3 on the frame portion S1 by patterning an electrode film to the wafer S (S30). At this occasion, the pair of extended electrodes S2, S3 are formed to be respectively electrically connected to the pair of mount electrodes 15, 16 through the connecting portions 11a. In addition thereto, the pair of extended electrodes S2, S3 are formed in a state of being aligned in parallel by constituting the interval L1 the same as the interval between the pair of mount electrodes 15, 16 along the width direction W of the piezoelectric plate 11 and formed such that a length L3 of a total along the width direction W becomes longer than a length L2 of a total of the pair of mount electrodes 15, 16 along the same direction W.

By having been processed by the outer shape forming step and the electrode forming step, the prepared wafer S having the predetermined thickness can be worked to the wafer S connected with a plurality of the piezoelectric vibrating pieces 2 having the piezoelectric plates 11, the pairs of exciting electrodes 14, and the pairs of mount electrodes 15, 16, and the wafer S including the frame portion S1 connected in the cantilever shape by way of the connecting portion 11a to the piezoelectric plate 11 in the state of directing the base end side, and the plurality of pair of extended electrodes S2, S3 formed to be respectively electrically connected to the pair of mount electrodes 15, 16 by way of the connecting portion 11a. In addition thereto, according to the wafer S, the pair of extended electrodes S2, S3 are formed in the state of being aligned in parallel by constituting the interval L1 the same as that of the pair of mount electrodes 15, 16 along the width direction W of the piezoelectric plate 11 and formed such that the length L3 of the total along the width direction W becomes longer than the length L2 of the total of the pair of mount electrodes 15, 16 along the same direction W.

Further, the weight metal films 21 (for example, sliver, gold or the like) including the rough adjusting films 21a and the fine adjusting films 21b for adjusting the frequency are coated to the front ends of the pair of vibrating arm portions 8, 9 at a timing the same time with or before or after the electrode forming step (S40)

Further, there is carried out a rough adjusting step (frequency adjusting step) of adjusting the frequency of the piezoelectric plate 11 while vibrating the pair of vibrating arm portions 8, 9 of the piezoelectric plate 11 (S50). Specifically explaining, first, the wafer S formed with the electrode film (pair of exciting electrodes 14, pair of mount electrodes 15, 16, lead out electrodes 19, 20 and pair of extended electrodes S2, S3) and the weight metal film 21 is set to a frequency adjustor (for example, oscillating circuit, network analyzer or the like), not illustrated. Further, the terminal (for example, probe or the like) of the frequency adjustor is contacted to the electrode film on the wafer S by a method mentioned later, and the predetermined drive voltage is applied to the pair of exciting electrodes 14. Thereby, the pair of vibrating arm portions 8, 9 are oscillated. The frequency is adjusted by reducing weights applied to the front ends of the pair of vibrating arm portions 8, 9 by irradiating laser light to the rough adjusting film 21a of the weight metal film 21. Further, a fine adjustment of adjusting the frequency further highly accurately is carried out later. An explanation will be given of the fine adjustment later.

Next, there is carried out a cutting step of cutting to separate the plurality of piezoelectric plates 11 from the frame portion S1 by cutting the connecting portion 11a connecting the wafer S and the piezoelectric plate 11 to respectively fragment (S60). Thereby, a plurality of the piezoelectric vibrating pieces 2 formed with the pairs of exciting electrodes 14 and the pairs of mount electrodes 15, 16 on the outer surfaces of the piezoelectric plates 11 can be fabricated at a time from the single wafer S. Further, the connecting portion 11a is cut by the cutting step, and therefore, also the pair of mount electrodes 15, 16 connected to the pair of extended electrodes S2, S3 by way of the connecting portion 11a are cut to separate simultaneously. Therefore, the pair of mount electrodes 15, 16 are constituted by the form formed to be respectively brought into contact with an edge end on the base end side of the piezoelectric plate 11 as shown by FIG. 2 and FIG. 3.

Next, an airtight terminal fabricating step of fabricating the plug 4 is carried out (S70). Specifically, first, the stem 30 is fabricated by a stem fabricating step (S71). That is, a bottomed cylinder member is formed by working a plate member having a conductivity of iron nickel cobalt alloy, iron nickel alloy or the like into a lance and carrying out deep drawing by a plurality of times. Further, a bottom face of the cylinder member is formed with an opening, the cylinder member is cut to separate from the plate member by carrying out outer shape drawing to thereby fabricate the stem 30.

Next, a setting step of respectively setting the lead terminal 31 and the filling member 32 at inside of the stem 30 is carried out (S72). First, the fabricated stem 30 is set to an exclusive jig, not illustrated, thereafter, the filling member 32 previously sintered in a ring-like shape is set to inside of the stem 30, and the lead terminal 31 is set to penetrate the filling member 32.

After combining the stem 30 and the lead terminal 31 and the filling member 32 by the setting step, the jig is put into a heating furnace and the filling member 32 is sintered in a temperature atmosphere around 1000° C. (S73). Thereby, an interval between the filling member 32 and the lead terminal 31 and an interval between the filling member 32 and the stem 30 are completely sealed to attach to constitute a structure withstanding airtightness. Further, the plug 4 can be provided by taking out the plug 4 from the jig. At the time point, the airtight terminal fabricating step is finished.

Next, there is carried out a plating step of coating the metal film of the same material on the outer surface of the lead terminal 31 and the outer periphery of the stem 30 by a wet plating method (S80). As a pretreatment therefor, the outer surface of the lead terminal 31 and the outer periphery of the stem 30 are cleaned, degreased by an alkaline solution, thereafter, cleaned by an acid by a solution of hydrochloric acid and sulfuric acid. After finishing the pretreatment, a matrix film is formed on the outer surface of the lead terminal 31 and the outer peripheral face of the stem 30. For example, Cu plating or Ni plating is coated by a film thickness of substantially 2 μm through 5 μm. Successively, a finish film is formed on the matrix film. For example, other than a single material of tin, silver or the like, heat resistant plating, tin copper alloy, tin bismuth film alloy, tin antimony alloy or the like is coated by a film thickness of substantially 8 μm through 15 μm.

By coating the metal film including the matrix film and the finish film in this way, the inner leads 31a and the piezoelectric vibrating piece 2 can be connected. Further, not only connection of the piezoelectric vibrating piece 2, but the metal film coated at the outer periphery of the stem 30 is provided with a property of being soft and elastically deformed, and therefore, cold pressure welding of the stem 30 and the case 3 can be carried out and airtight bonding can be carried out.

Successively, in order to stabilize the metal film, annealing is carried out in a furnace of a vacuum atmosphere (S90). Further, heating of one hour is carried out at a temperature of 170° C. Thereby, whisker can be restrained from being brought about by adjusting a composition of an intermetallic compound formed at an interface of the material of the matrix film and a material of the finish film. At a time point of finishing the annealing, a mount step can be carried out. Further, although an example is taken by a case of carrying out by the wet plating method in coating the metal film, the invention is not limited to the case but the coating may be carried out by a vapor deposition method, a chemical gas phase method or the like.

Further, according to the embodiment, after finishing annealing, the conducting bump E of gold or the like is formed at the front end of the inner lead 31a for the mount step which is carried out next (S100). Further, the mount step of bonding the mount electrodes 15, 16 of the piezoelectric vibrating piece 2 to the inner lead 31a is carried out (S110). Specifically, the inner lead 31a and the piezoelectric vibrating piece 2 are overlapped by a predetermined pressure in a state of interposing the bump E while heating the bump E. Thereby, the inner leads 31a and the mount electrodes 15, 16 can be connected by way of the bumps E. As a result, the piezoelectric vibrating piece 2 can be mounted. That is, the piezoelectric vibrating piece 2 is brought into a state of being mechanically supported by and electrically connected to the lead terminals 31.

Further, although mounting is carried out by carrying out heating and pressurizing in carrying out bump connection, the bump connection may be carried out by utilizing an ultrasonic wave.

Next, before carrying out the sealing step, in order to eliminate strain by the above-described mounting, baking is carried out at a predetermined temperature (S120). Successively, the frequency of the piezoelectric vibrating piece 2 is finely adjusted (S130). Specifically explaining of the frequency adjustment, the piezoelectric vibrating piece 2 is vibrated by applying a voltage between the outer leads 31b in a state of putting the total in a vacuum chamber. Further, the frequency is adjusted by evaporating the fine adjusting film 21b of the weight metal film 21 by a laser while measuring the frequency. Further, in order to measure the frequency, the measurement can accurately be carried out by pressing the front end of a probe, not illustrated, to the outer lead 31b. By carrying out the frequency adjustment, the frequency of the piezoelectric vibrating piece 2 can be adjusted within the previously determined frequency range.

Further, although in the above-described fine adjustment and the rough adjustment carried out previously, the frequency adjustment is carried out by evaporating the weight metal film 21 by irradiating laser, not laser but argon ion may be utilized. In this case, the frequency adjustment is carried out by removing the weight metal film 21 by carrying out sputtering by irradiating argon ion.

Finally, there is carried out a case press-fitting step of sealing the piezoelectric vibrating piece 2 in airtight by press-fitting the case 3 to the stem 30 to contain the mounted piezoelectric vibrating piece 2 at inside thereof (S140). Specifically explaining, the case 3 is press-fit to the outer periphery of the stem 30 while applying a predetermined load in vacuum. Then, the metal film formed at the outer periphery of the stem 30 is elastically deformed, and therefore, sealing in airtight can be carried out by cold pressure welding. Thereby, sealing in vacuum can be carried out by hermetically closing the piezoelectric vibrating piece 2 to inside of the case 3.

Further, it is preferable that before carrying out the step, by sufficiently heating the piezoelectric vibrating piece 2, the case 3 and the plug 4, moisture or the like adsorbed to surfaces thereof is detached.

Further, after finishing to fix the case 3, screening is carried out (S150). The screening is carried out for stabilizing the frequency and the resonance resistance value, and restraining a metal whisker caused by a compressing stress from being brought about at the fitting portion press-fit to the case 3.

After finishing the screening, an electric property inspection of an inner portion is carried out (S160). That is, the resonance frequency, the resonance resistance value, a drive level characteristic (exciting power dependency of the resonance frequency and the resonance resistance value) of the piezoelectric vibrating piece 2 and the like are measured and checked. Further, an insulating resistance property or the like is checked along therewith. Further, finally, a dimension, a quality or the like is finally checked by carrying out an outlook inspection of the piezoelectric vibrator 1. As a result, the piezoelectric vibrator 1 shown in FIG. 1 can be fabricated.

Particularly, in carrying out the rough adjusting step, different from the background art, the pair of vibrating arm portions 8, 9 of the piezoelectric plate 11 can be vibrated by applying a drive voltage by contacting the terminals of the frequency adjustor respectively between the pair of extended electrodes S2, S3 formed on the frame portion S1. In the case of the background art, it is necessary to contact the terminals for both of the pair of mount electrodes 15, 16 on the piezoelectric plate 11. That is, it is necessary to contact the two terminals to the one piezoelectric plate 11. Therefore, in order to accurately carry out the contact, it is necessary to accurately position the two terminals to the pair of mount electrodes 15, 16 in a state of making the two terminals as close to the pair of mount electrodes 15, 16 as possible.

In contrast thereto, in the case of the invention, the terminals may be contacted to both of the pair of extended electrodes S2, S3 on the frame portion S1. A size of the frame portion S1 formed with the pair of extended electrodes S2, S3 is not restricted as in the piezoelectric plate 11 formed with the pair of mount electrodes 15, 16. Therefore, according to the pair of extended electrodes S2, S3, an interval between the electrodes can be ensured to be larger than that of the pair of mount electrodes 15, 16. Therefore, when the terminals are contacted to the pair of extended electrodes S2, S3, it is not necessary to make the two terminals proximate thereto as in the background art. Therefore, the control of the terminals can easily be carried out, and the frequency adjustment can be carried out more speedily and accurately. Further, an efficient operation can be carried out.

In addition thereto, in the electrode forming step, the pair of extended electrodes S2, S3 are formed in a state of being aligned in parallel by constituting the interval L1 the same as that between the pair of mount electrodes 15, 16 along the width direction W of the piezoelectric plate 11 and formed such that the length L3 along the width direction W becomes longer than the length L2 of the total of the pair of mount electrodes 15, 16 along the same width direction W. Therefore, in contacting the terminals to the pair of extended electrodes S2, S3 in the rough adjusting step, the contact can be carried out by widening the interval between the terminals in a direction the same as the direction of aligning the pair of mount electrodes 15, 16. Therefore, a control for widening the interval between the terminals can easily be carried out. Thereby, the frequency adjustment can be carried out further speedily and accurately.

Further, even when the pair of mount electrodes 15, 16 per se become small such that it is difficult to contact the terminals thereto assumedly in accordance with further small-sized formation, the terminals may be contacted to the pair of extended electrodes S2, S3, and therefore, the contact is not influenced by the size of the piezoelectric vibrating piece 2. Thereby, the frequency adjustment can firmly be carried out without being influenced by the size of the piezoelectric vibrating piece 2.

Further, according to the piezoelectric vibrator 1 of the embodiment, the above-described piezoelectric vibrating piece 2 is provided, and therefore, the predetermined frequency can be ensured, and high quality formation and low cost formation of the piezoelectric vibrator 1 can be achieved.

Further, when the terminal of the frequency adjustor is contacted to the electrode film, normally, a contact mark, not illustrated, is formed at a contact portion of the electrode film. However, the terminals are not contacted to the pair of mount electrodes 15, 16 as described above, and therefore, the contact marks are not formed.

Second Embodiment

Next, a second embodiment according to the invention will be explained in reference to FIG. 12. Further, in the second embodiment, portions the same as constituent elements of the first embodiment are attached with the same notations and an explanation thereof will be omitted.

The second embodiment differs from the first embodiment in the electrode formed at the electrode forming step. That is, although according to the first embodiment, the pair of extended electrodes S2, S3 are simply formed, according to the second embodiment, a common extended electrode S4 is formed in addition to the pair of extended electrodes S2, S3.

Figure 12:
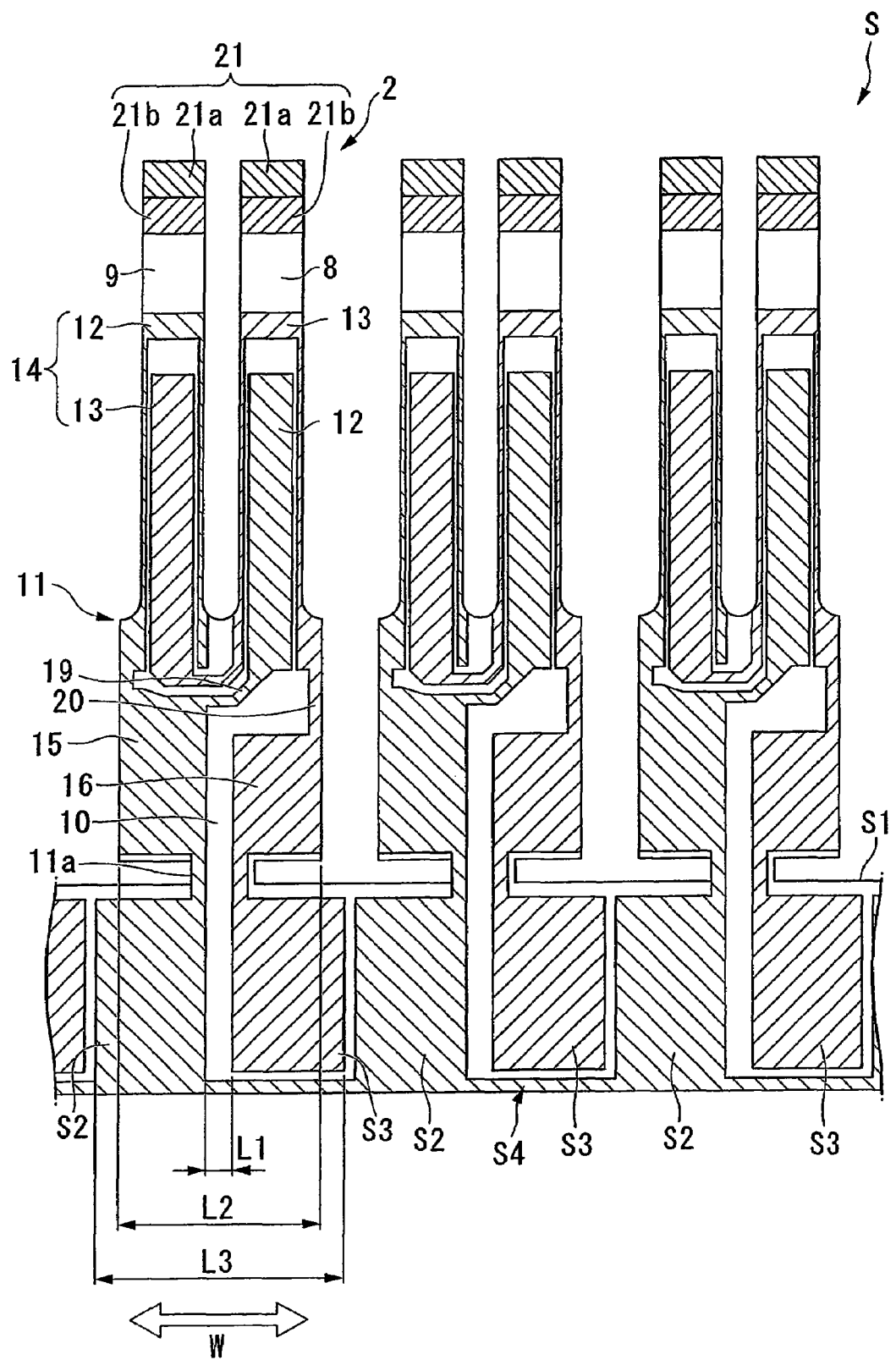
FIG. 12 is one step view for explaining a method of fabricating a piezoelectric vibrating piece of a second embodiment according to the invention, and a view enlarging an upper face of a wafer of a state of forming an electrode film and a weight metal film on the wafer from the state shown in FIG. 10.

Explaining in details, according to the embodiment, in the electrode forming step, as shown by FIG. 12, the common extended electrode S4 is formed by respectively electrically connecting the plurality of extended electrodes S2 on one side. That is, the common extended electrode S4 is formed to a state of being conducted to all of the mount electrodes 15 on one side respectively formed at the plurality of piezoelectric plates 11 connected to the frame portion S1.

By being processed by the electrode forming step, the wafer S can be worked into the wafer S including the common extended electrode S4 formed by electrically connected respectively the plurality of extended electrodes S2 on one side.

According to the fabricating method of the embodiment, operation and effect shown in the first embodiment are achieved, further, when the rough adjusting step is carried out, the pair of vibrating arm portions 8, 9 of the piezoelectric plate 11 can be vibrated by applying a drive voltage by contacting the terminals of the frequency adjustor respectively to the common extended electrode S4 on the frame portion S1 and the other extended electrode S3. Therefore, it is not necessary to make the two terminals proximate to each other. Further, the terminal to be contacted to the common extended electrode S4 may be contacted to a previously set predetermined position on the common extended electrode S4 without depending on the position of the piezoelectric plate 11 to be vibrated. Therefore, the control of the terminal can further easily be carried out, and the frequency adjustment can be carried out further speedily and accurately.

Further, according to the embodiment, in the rough adjusting step, it is preferable that the pairs of vibrating arm portions 8, 9 of the piezoelectric plates 11 are not vibrated set by set but the frequencies of the piezoelectric plates 11 are adjusted while simultaneously vibrating a plurality of sets of the pairs of vibrating arm portions 8, 9 of the piezoelectric plates 11 by applying the drive voltage by contacting the terminals to the common extended electrode S4 and a plurality of extended electrodes S3 on other side. Thereby, the frequency adjustment can further efficiently be carried out and the fabricating efficiency can be promoted.

Meanwhile, when the pairs of vibrating arm portions 8, 9 of the plurality of sets of piezoelectric plates 11 are vibrated simultaneously in the background art, it is necessary to contact the terminals respectively to the pair of mount electrodes 15, 16 of the respective piezoelectric plates 11, and therefore, a number of the terminals needs to be twice as much as the number of the piezoelectric plates 11.

In contrast thereto, the common extended electrode S4 is utilized, and therefore, the terminals may be contacted to the common extended electrode S4 and the plurality of extended electrodes S3 on other side. Therefore, the number of terminals are not the number twice as much as the number of the piezoelectric plates 11 to be vibrated but a number of adding the number of the piezoelectric plates 11 to be vibrated and one for the common extended electrode S4. Therefore, the number of terminals can considerably be reduced in comparison with that of the background art, a reduction in const can be achieved. Further, the number of the terminals can considerably be reduced, further, the one terminal may be contacted to the one piezoelectric plate 11, and therefore, the control of the terminal becomes easy invariably. Therefore, even when the frequency adjustment is carried out simultaneously to a plurality thereof, the frequency adjustment can easily and accurately be carried out.

Further, even when the interval of the contiguous piezoelectric plates 11 is narrowed by assumedly achieving further small-sized formation, only the one terminal may be contacted to the one piezoelectric plate 11, and therefore, the contact can be carried out easily. Therefore, the frequency adjustment can firmly be carried out without being influenced by the size of the piezoelectric vibrating piece 2.

In addition thereto, the number of terminals can considerably be reduced, and therefore, a number of steps consumed for maintenance of the terminal can be reduced. Therefore, maintenance performance can be promoted.

Figure 13:
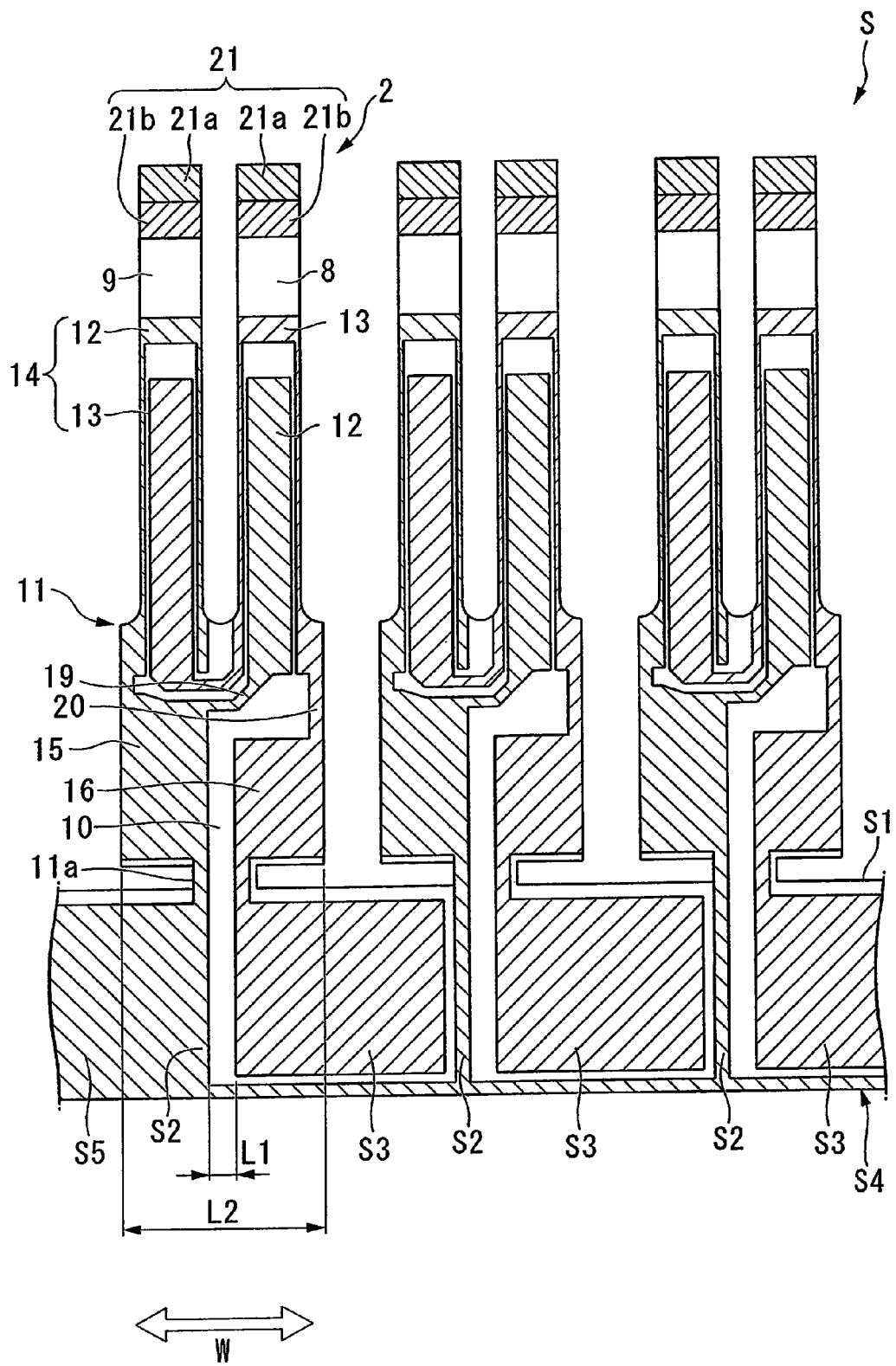
FIG. 13 is a view enlarging an upper face of a wafer of a state of forming a shape of one extended electrode to narrow in a width dimension of a piezoelectric plate constituting a modified example of the second embodiment according to the invention.

Further, although according to the embodiment, the extended electrode S2 on one side is constituted by a shape similar to that of the first embodiment, the shape is not limited thereto. For example, as shown by FIG. 13, the extended electrode S2 on one side may be constituted by a shape narrowed in the width direction W of the piezoelectric plate 11. Thereby, a length of a total of the pair of extended electrodes S2, S3 along the width direction W can be narrowed on the frame portion S1. Therefore, the interval of the piezoelectric plates 11 contiguous to each other can be narrowed and a total number of the piezoelectric plates 11 which can be fabricated from the single wafer S can be increased.

Further, at this occasion, it is preferable to form the common extended electrode S4 to form a contact portion S5 larger than the mount electrode 15 on one side. According thereto, when the terminal is contacted to the common extended electrode S4, a control of the terminal can be made to be easy by contacting to the contact portion S5.

Further, although according to the embodiment, an explanation has been given by taking an example of the piezoelectric vibrator 1 including the piezoelectric vibrating piece 2 of the tuning fork type, the embodiment is not limited to the piezoelectric vibrator 1.

Figure 14:
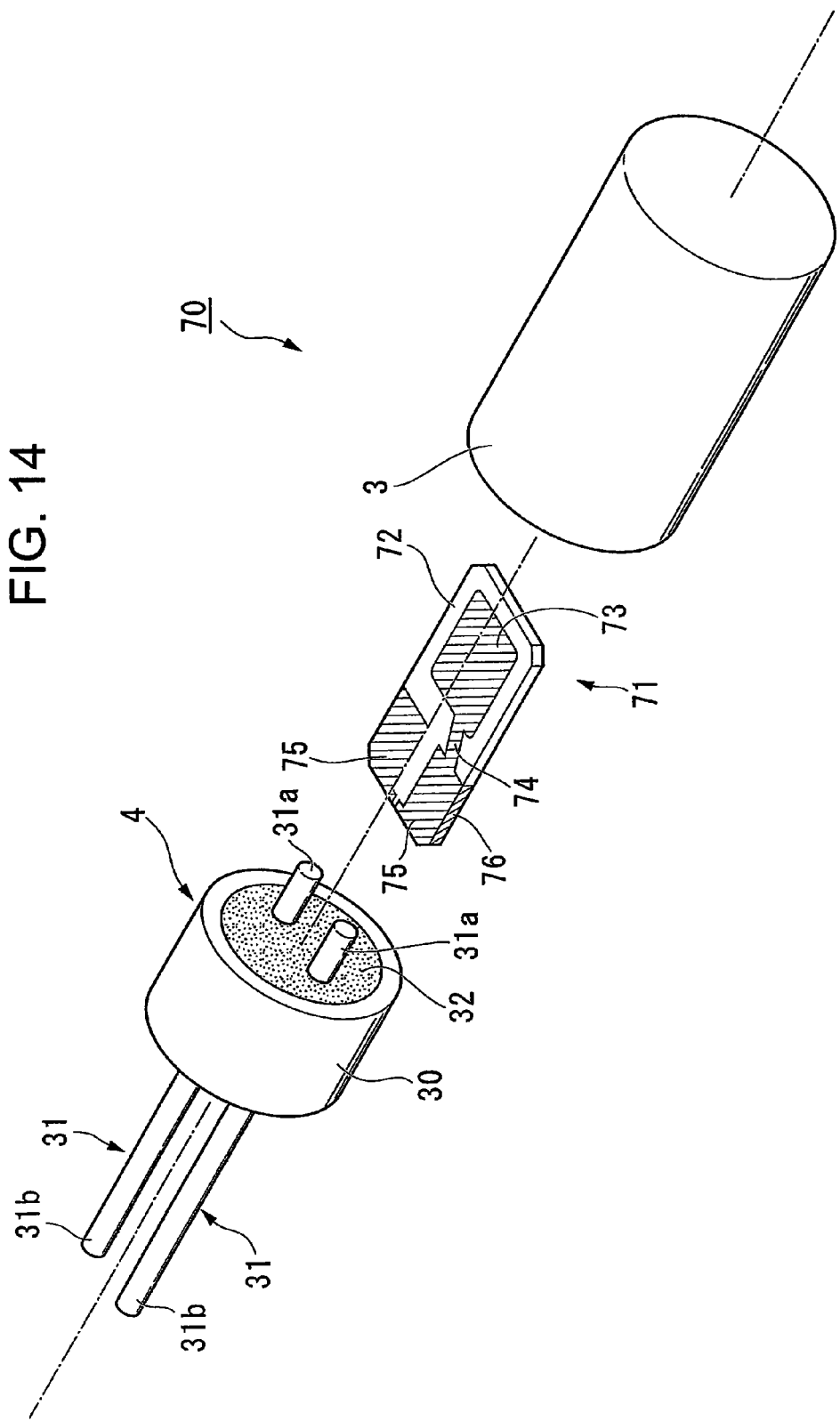
FIG. 14 is a view showing other examples of a piezoelectric vibrating piece and a piezoelectric vibrator according to the invention and is a disassembled perspective view of the piezoelectric vibrator having the piezoelectric vibrating piece of carrying out a thickness slipping vibration.

For example, as shown by FIG. 14, a thickness slipping vibrator (piezoelectric vibrator) 70 including a thickness slipping vibrating piece (piezoelectric vibrating piece) 71 will do. The thickness slipping vibrating piece 71 includes a piezoelectric plate 72 formed in a plate-like shape by a constant thickness from the wafer S, and an exciting electrode 73, a lead out electrode 74, and a mount electrode 75. The piezoelectric plate 72 is formed in, for example, a rectangular shape in an outer shape thereof, and formed such that the exciting electrodes 73 are opposed to each other substantially at center portions of both faces. An end portion of the piezoelectric plate 72 is formed with the mount electrode 75 electrically connected to the exciting electrode 73 by way of the lead out electrode 74. Further, the mount electrode 75 connected to the one exciting electrode 73 and the mount electrode 75 connected to the other exciting electrode 73 are respectively formed on the both faces of the piezoelectric plate 72. At this occasion, the mount electrode 75 formed at the one face of the piezoelectric plate 72 is electrically connected to the mount electrode 75 formed on the other face by way of a side face electrode 76 formed on a side face of the piezoelectric plate 72.

Even the thickness slipping vibrator 70 constituted in this way can achieve high quality and low cost formation of the thickness slipping vibrator 70 per se similarly since the thickness slipping vibrating piece 71 is fabricated by the above-described method of fabricating the piezoelectric vibrating piece.

Figure 15:
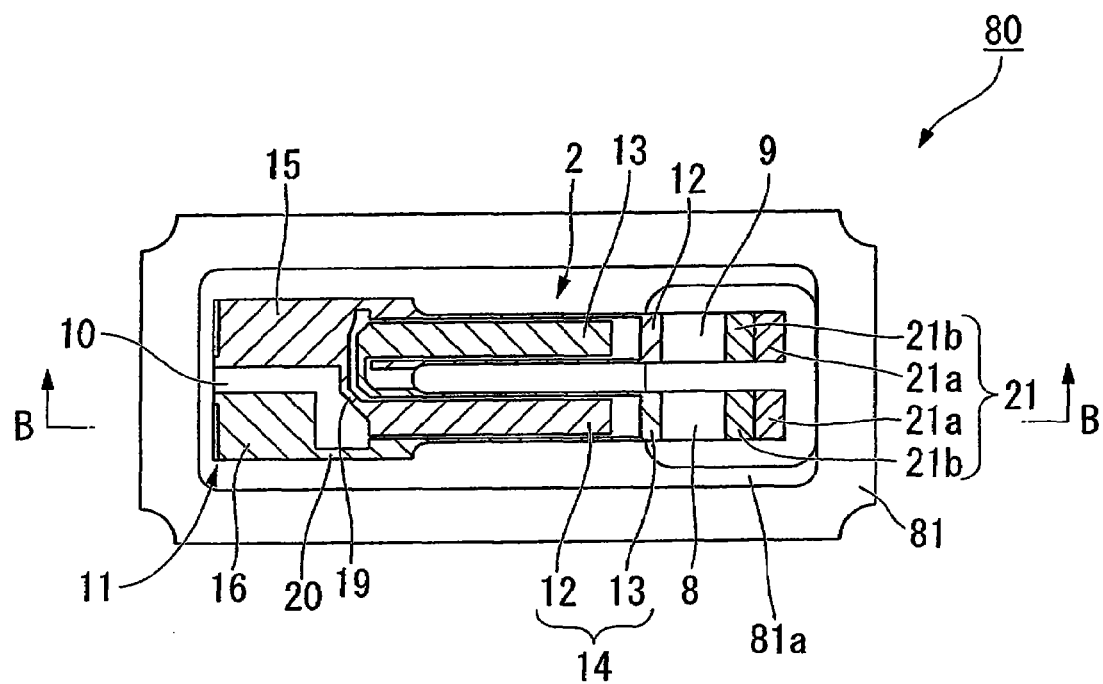
FIG. 15 is a view showing other example of a piezoelectric vibrator according to the invention and is a top view of a piezoelectric vibrator of a ceramic package type.
Figure 16:
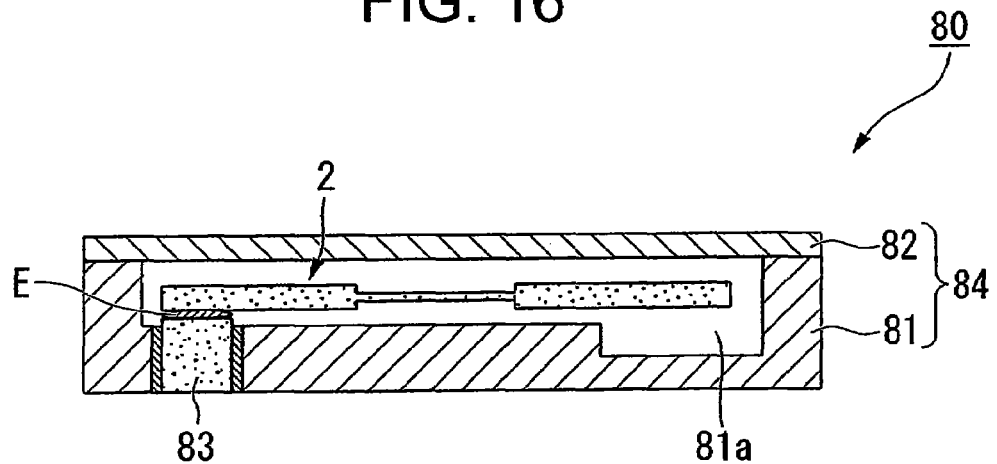
FIG. 16 is a sectional view taken along a line B-B shown in FIG. 15.

Further, although according to the embodiment, as the example of the piezoelectric vibrator, an explanation has been given by taking an example of the piezoelectric vibrator 1 of the cylinder package type, the embodiment is not limited to the piezoelectric vibrator 1. For example, as shown by FIG. 15 and FIG. 16, a piezoelectric vibrator 80 of a ceramic package type will do.

The piezoelectric vibrator 80 includes a base 81 formed with a recess portion 81a at inside thereof, the piezoelectric vibrating piece 2 contained at inside of the recess portion 81a of the base 81, and a lid 82 fixed to the base 81 in a state of containing the piezoelectric vibrating piece 2.

The base 81 is arranged with a lead 83 having a hermetic sealing structure, and a front end thereof is provided with a bump E. Further, the bumps E and the mount electrodes 15, 16 of the piezoelectric vibrating piece 2 are mechanically and electrically connected. Further, the lead 83 is exposed to a bottom face of the base 81. That is, the lead 83 is made to function as an outer portion connecting terminal one end side of which is electrically connected to outside and other end side of which is electrically connected to the mount electrodes 15, 16.

Further, the base 81 is sealed in airtight in vacuum using various means of electron beam welding in vacuum, vacuum seam welding, or bonding by low melting point glass or eutectic metal. Thereby, the piezoelectric vibrating piece 2 is sealed in airtight at inside thereof. That is, the base 81 and the lid 82 are made to function as sealing member 84 for sealing the piezoelectric vibrating piece 2 in airtight.

Even the piezoelectric vibrator 80 constituted in this way can achieve high quality formation and low cost formation of the piezoelectric vibrator 80 per se similarly since the piezoelectric vibrating piece 2 is fabricated by the above-described method of fabricating the piezoelectric vibrating piece.

Further, a surface mounting type vibrator 90 may be constituted by fixing the piezoelectric vibrator 1 of the cylinder package type further by a mold resin portion 91.

Figure 17:
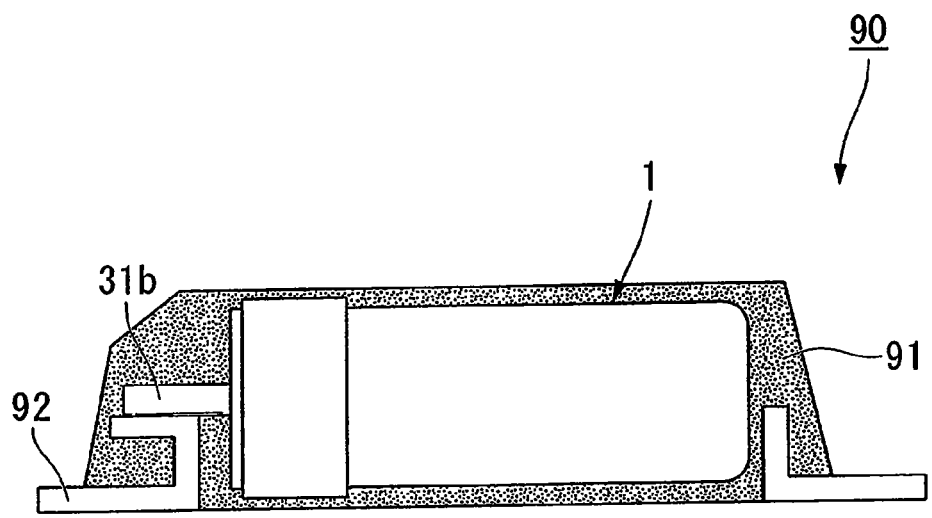
FIG. 17 is a sectional view showing a surface mounting type vibrator having a piezoelectric vibrator according to the invention.
Figure 18:
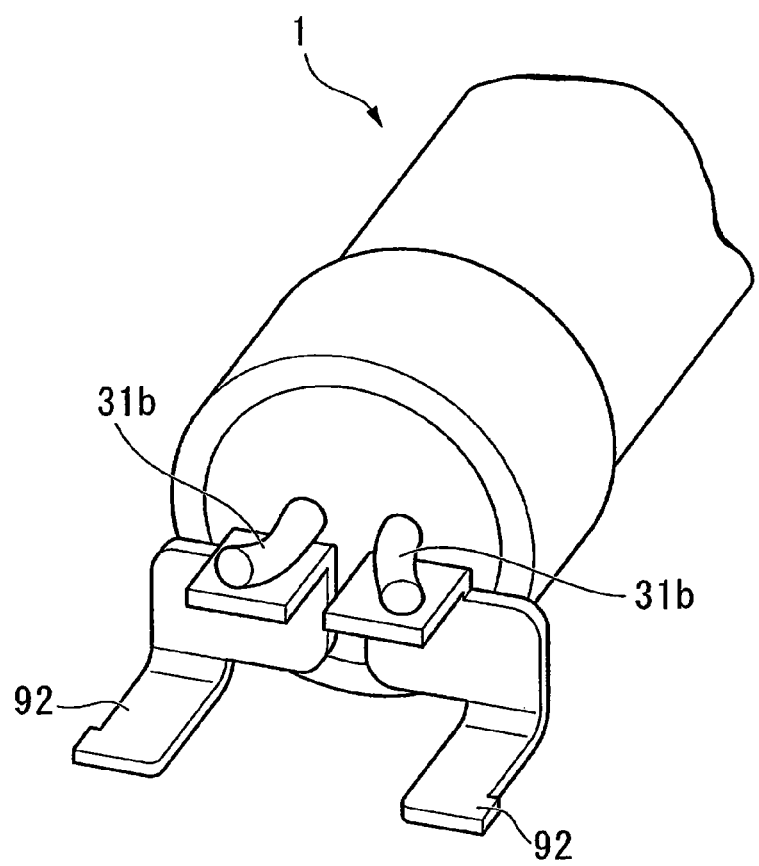
FIG. 18 is a perspective view showing a relationship between the piezoelectric vibrator shown in FIG. 17 and an outer portion connecting terminal.

As shown by FIG. 17 and FIG. 18, the surface mounting type vibrator 90 includes the piezoelectric vibrator 1, the mold resin portion 91 of fixing the piezoelectric vibrator 1 by a predetermined shape, and an outer portion connecting terminal 92 one end side of which is electrically connected to the outer lead 31b and other end side of which is electrically connected to outside by being exposed at a bottom face of the mold resin portion 91. The outer portion connecting terminal 92 is formed in a channel shape in a section thereof by a metal material of copper or the like. By fixing the piezoelectric vibrator 1 by the mold resin portion 91 in this way, the piezoelectric vibrator 1 can stably be attached to the circuit board or the like, and therefore, the piezoelectric vibrator 1 is easier to use and an easiness of use is promoted. Particularly, the piezoelectric vibrator 1 is brought into high quality formation and low cost formation, and therefore, high quality formation and low cost formation can be achieved also with regard to the surface mounting type vibrator 90 per se.

Next, an embodiment of an oscillator according to the invention will be explained in reference to FIG. 19.

Figure 19:
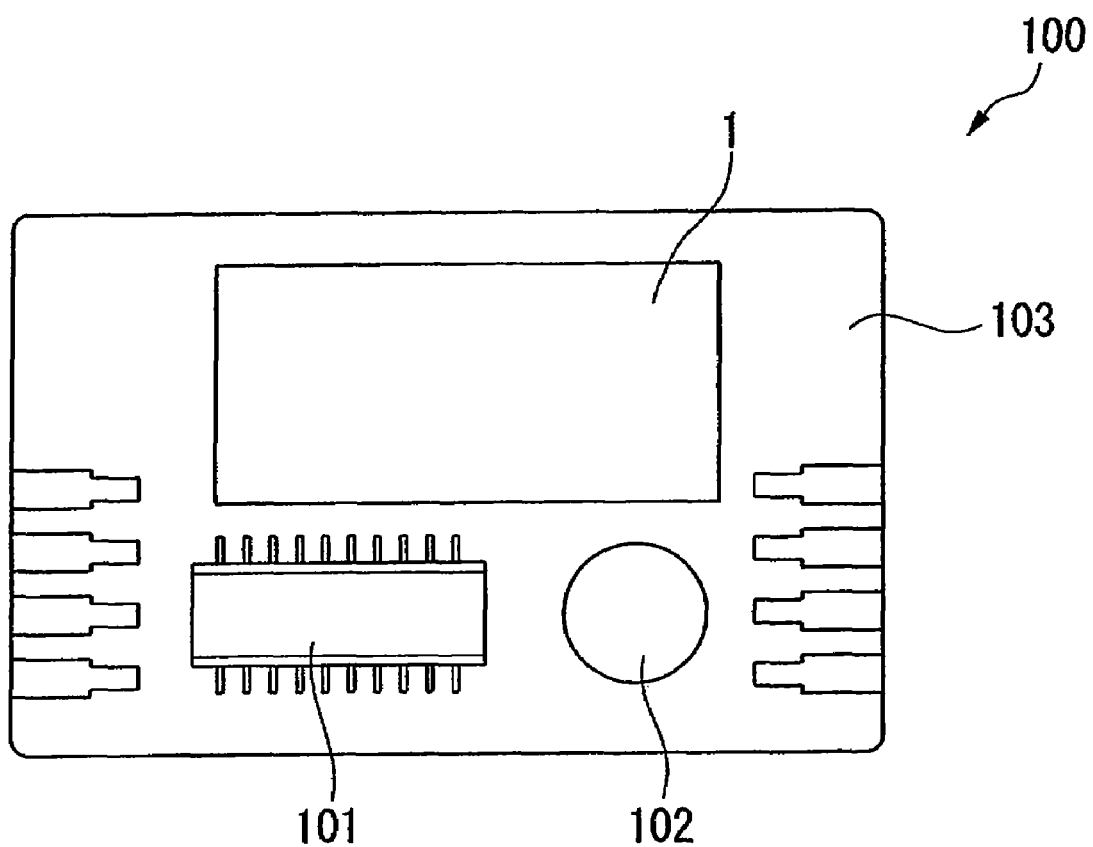
FIG. 19 is a constituting view showing an embodiment of an oscillator according to the invention.

According to an oscillator 100 of the embodiment, as shown by FIG. 19, the piezoelectric vibrator 1 is constituted as an oscillating piece electrically connected to an integrated circuit 101. The oscillator 100 includes a board 103 mounted with an electronic part 102 of a capacitor or the like. The board 103 is mounted with the integrated circuit 101 for the oscillator, and the piezoelectric vibrator 1 is mounted to a vicinity of the integrated circuit 101. The electronic part 102, the integrated circuit 101 and the piezoelectric vibrator 1 are electrically connected respectively by wiring patterns, not illustrated. Further, the respective constituent parts are molded by a resin, not illustrated.

In the oscillator 100 constituted in this way, when a voltage is applied to the piezoelectric vibrator 1, the piezoelectric vibrating piece 2 at inside of the piezoelectric vibrator 1 is vibrated. The vibration is converted into an electric signal by a piezoelectric property provided to the piezoelectric vibrating piece 2 and is inputted to the integrated circuit 101 as an electric signal. The inputted electric signal is variously processed by the integrated circuit 101 and is outputted as a frequency signal. Thereby, the piezoelectric vibrator 1 is functioned as an oscillating piece.

Further, by selecting a constitution of the integrated circuit 101 in accordance with a request of an RTC (real time clock) module or the like, other than a single function oscillator for a timepiece, a function of controlling date or time of operating the apparatus or outside apparatus, or providing time, calendar or the like can be added.

As described above, according to the oscillator 100 of the embodiment, the piezoelectric vibrator 1 brought into high quality formation and low cost formation is provided, and therefore, also the oscillator 100 per se can similarly achieve high quality formation and low cost formation. Further, in addition thereto, a highly accurate frequency signal which is stable over a long period of time can be provided.

Figure 20:
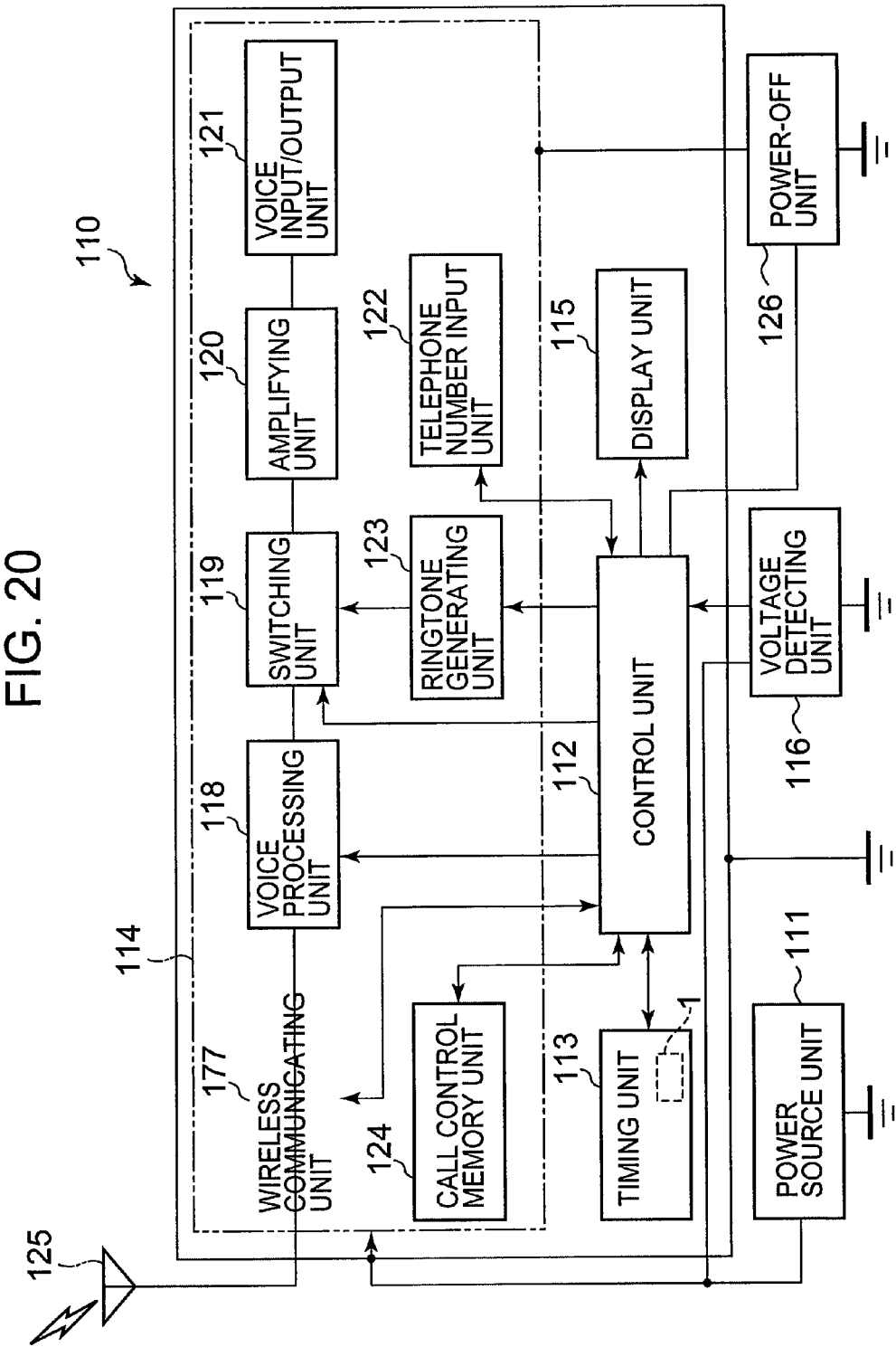
FIG. 20 is a constitution view showing an embodiment of an electronic apparatus according to the invention.

Next, an embodiment of an electronic apparatus according to the invention will be explained in reference to FIG. 20. Further, as an electronic apparatus, an explanation will be given by taking an example of a portable information apparatus 110 having the piezoelectric vibrator 1 mentioned above. First, the portable information apparatus 110 of the embodiment is represented by a portable telephone and develops and improves a wristwatch according to the background art. An outlook thereof is similar to a wristwatch, a liquid crystal display is arranged at a portion in correspondence with a dial and current time or the like can be displayed on a screen thereof. Further, when utilized as a communicating machine, a communication similar to that of the portable telephone of the background art can be carried out by detaching the communicating machine from the wrist and by a speaker and a microphone included at an inner side portion of a strap. However, in comparison with the portable telephone of the background art, the communicating machine is remarkably small-sized and light weighted.

Next, a constitution of the portable information apparatus 110 of the embodiment will be explained. As shown by FIG. 20, the portable information apparatus 110 includes the piezoelectric vibrator 1, and a power source portion 111 for supplying a power. The power source portion 111 includes, for example, a lithium secondary cell. The power source portion 111 is connected in parallel with a control portion 112 for carrying out various controls, a time counting portion 113 of counting time or the like, a communicating portion 114 for carrying out a communication with outside, a display portion 115 for displaying various information, and a voltage detecting portion 116 of detecting voltages of respective function portions. Further, the power is supplied to the respective function portions by the power source portion 111.

The control portion 112 controls an operation of a total of a system of receiving and transmitting voice date, measuring and displaying current time or the like. Further, the control portion 112 includes ROM previously written with programs, CPU of reading and executing programs written to the ROM, a RAM used as a work area of the CPU and the like.

The time counting portion 113 includes an integrated circuit including an oscillating circuit, a register circuit, a counter circuit and an interface circuit and the like, and the piezoelectric vibrator 1. When a voltage is applied to the piezoelectric vibrator 1, the piezoelectric vibrating piece 2 is vibrated, the vibration is converted into an electric signal by a piezoelectric property provided to quartz and is inputted to an oscillating circuit as an electric signal. An output of the oscillating circuit is binarized and is counted by the register circuit and the counter circuit. Further, a signal is transmitted to and received from the control portion 112 by way of the interface circuit, and the display portion 115 is displayed with current time or current date or calendar information or the like.

The communicating portion 114 is provided with a function similar to that of the portable telephone of the background art and includes a wireless portion 117, a voice processing portion 118, a switching portion 119, amplifying portion 120, a voice inputting and outputting portion 121, a telephone number inputting portion 122, an arrival sound generating portion 123, and a call control memory portion 124.

The wireless portion 117 exchanges to transmit to receive various data of voice data or the like to and from a base station by way of an antenna 125. The voice processing portion 118 codes and decodes a voice signal inputted from the wireless portion 117 or the amplifying portion 120. The amplifying portion 120 amplifies a signal inputted from the voice processing portion 118 or the voice inputting and outputting portion 121 to a predetermined level. The voice inputting and outputting portion 121 includes a speaker, a microphone and the like for making an arrival sound or received voice, or collecting voice.

Further, the arrival sound generating portion 123 generates arrival sound in accordance with call from a base station. The switching portion 119 switches the amplifying portion 120 connected to the voice processing portion 118 to the arrival sound generating portion 123 only in arrival of signal, thereby, arrival sound generated at the arrival sound generating portion 123 is outputted to the voice inputting and outputting portion 121 by way of the amplifying portion 120.

Further, the call control memory portion 124 stores a program related to a call control of transmission and arrival of communication. Further, the telephone number inputting portion 122 includes, for example, number keys of 0 through 9 and other key, and a telephone number of a speech destination or the like is inputted by depressing the number keys and the like.

When the voltages applied to the respective function portions of the control portion 112 and the like by the power source portion 111 become lower than a predetermined value, the voltage detecting portion 116 detects the voltage drop to inform to the control portion 112. The predetermined voltage value at this occasion is a value previously set as a minimum voltage necessary for stably operating the communicating portion 114 and is, for example, about 3V. The control portion 112 informed of the voltage drop of the voltage detecting portion 116 prohibits operations of the wireless portion 117, the voice processing portion 118, the switching portion 119 and the arrival sound generating portion 123. Particularly, it is indispensable to stop the operation of the wireless portion 117 having a large power consumption. Further, a statement that the communicating portion 114 cannot be used by a deficiency in a remaining amount of the battery is displayed on the display portion 115.

That is, the operation of the communicating portion 114 can be prohibited and the statement can be displayed on the display portion 115 by the voltage detecting portion 116 and the control portion 112. Although the display may be a character message, x (check) mark may be attached to a telephone icon displayed at an upper portion of a display face of the display portion 115 as a further intuitive display.

Further, by providing the power source cutting portion 126 capable of selectively cutting the power source of the portion related to the function of the communicating portion 114, the function of the communicating portion 114 can further firmly be stopped.

As described above, according to the portable information apparatus 110 of the embodiment, the piezoelectric vibrator 1 brought into high quality formation and low cost formation is provided, and therefore, also the portable information apparatus per se can similarly achieve high quality formation and low cost formation. Further, in addition thereto, highly accurate timepiece information which is stable over a long period of time can be displayed.

Next, an embodiment of a radiowave timepiece according to the invention will be explained in reference to FIG. 21.

Figure 21:
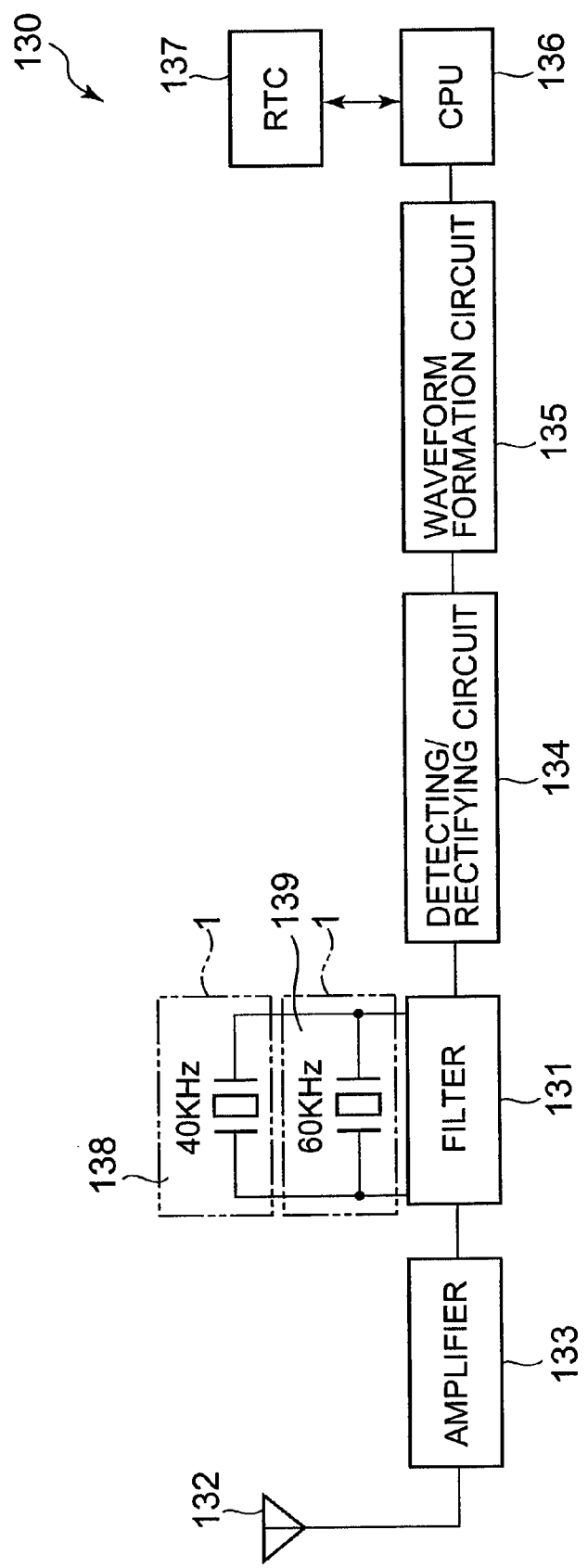
FIG. 21 is a constitution view showing an embodiment of a radiowave timepiece according to the invention.

As shown by FIG. 21, a radiowave timepiece 130 of the embodiment includes the piezoelectric vibrator 1 electrically connected to a filter portion 131, and a timepiece having a function of automatically correcting time to accurate time to display by receiving a standard radiowave including time information.

In Japan, there are transmission places (transmission stations) of transmitting the standard radiowave at Fukushima prefecture (40 kHz) and Saga prefecture (60 kHz), respectively transmitting the standard radiowave. A long wave of 40 kHz or 60 kHz is provided with both of a property of propagating on the ground surface and propagating while being reflected by the ionosphere and the ground surface, and therefore, a propagating range is wide, and all of Japan is covered by the two transmitting places.

A function constitution of the radiowave timepiece 130 will be explained in details.

An antenna 132 receives the standard radiowave of the long wave of 40 kHz or 60 kHz. The standard radiowave of the long wave subjects time information referred to as time code to AM modulation to a carrier wave of 40 kHz or 60 kHz. The received standard radiowave of the long wave is amplified by an amplifier 133, filtered and tuned by the filter portion 131 having a plurality of the piezoelectric vibrators 1. The piezoelectric vibrators 1 according to the embodiment respectively include quartz vibrator portions 138, 139 having resonance frequencies of 40 kHz and 60 kHz the same as the carrier frequency.

Further, the filtered signal of the predetermined frequency is detected and decoded by a detecting, rectifying circuit 134. Successively, the time code is taken out by way of a waveform shaping circuit 135, and counted by CPU 136. CPU 136 reads information of current year, accumulated date, day of week, time or the like. The read information is reflected to RTC 137 and accurate time information is displayed.

The carrier wave is provided with 40 kHz or 60 kHz, and therefore, the vibrators having the above-described structure of the tuning fork type are preferable for the quartz vibrator portions 138, 139.

Further, although the above-described explanation has been shown by the example of Japan, the frequency of the standard radiowave of long wave differs overseas. For example, in Germany, a standard radiowave of 77.5 kHz is used. Therefore, when the radiowave timepiece 130 capable of dealing with overseas is integrated to a portable apparatus, the piezoelectric vibrator 1 of a frequency which differs from that of the case of Japan is further needed.

As described above, according to the radiowave timepiece 130 of the embodiment, the piezoelectric vibrator 1 brought into high quality formation and low cost formation is provided, and therefore, also the radiowave timepiece per se can similarly achieve high quality formation and low cost formation. Further, in addition thereto, time can be counted highly accurately and stably over a long period of time.

Although the embodiment of the invention has been described in details in reference to the drawings as described above, a specific constitution is not limited to the embodiment but a design change or the like within the range not deviated from the gist of the invention is included. For example, although in the oscillator, the portable information apparatus and the radiowave timepiece mentioned above, the piezoelectric vibrator 1 of the cylinder package type having the piezoelectric vibrating piece 2 of the tuning fork type is used, the embodiment in not limited thereto. The thickness slipping type 70, the piezoelectric vibrator 80 of the ceramic package type, the surface mounting type vibrator 90 or the like may be used as the piezoelectric vibrator.

Figure 22:
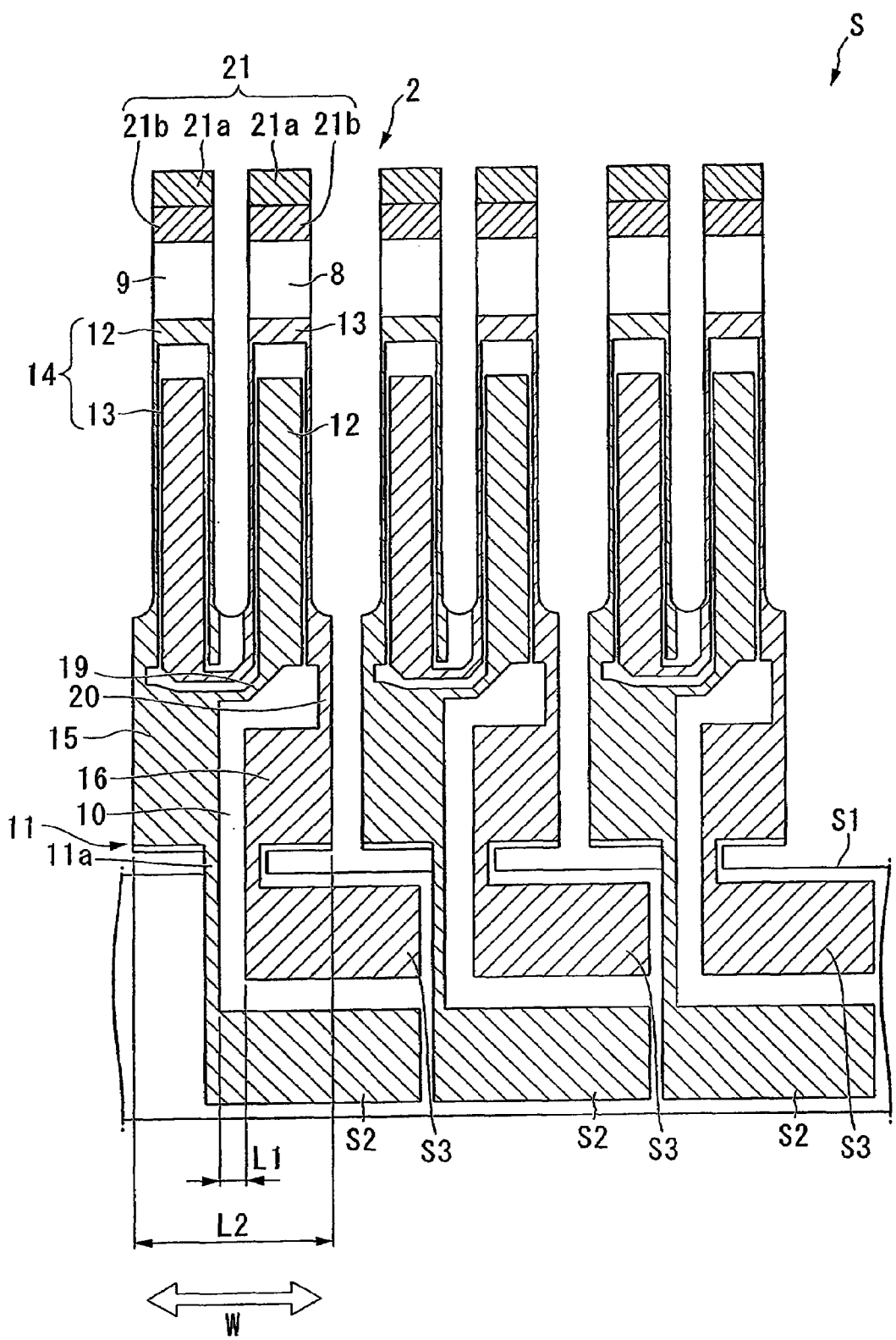
FIG. 22 is a view for explaining a modified example of the invention and is a view enlarging an upper face of a wafer in a state of forming an electrode film and a weight metal film on the wafer.
Figure 23:
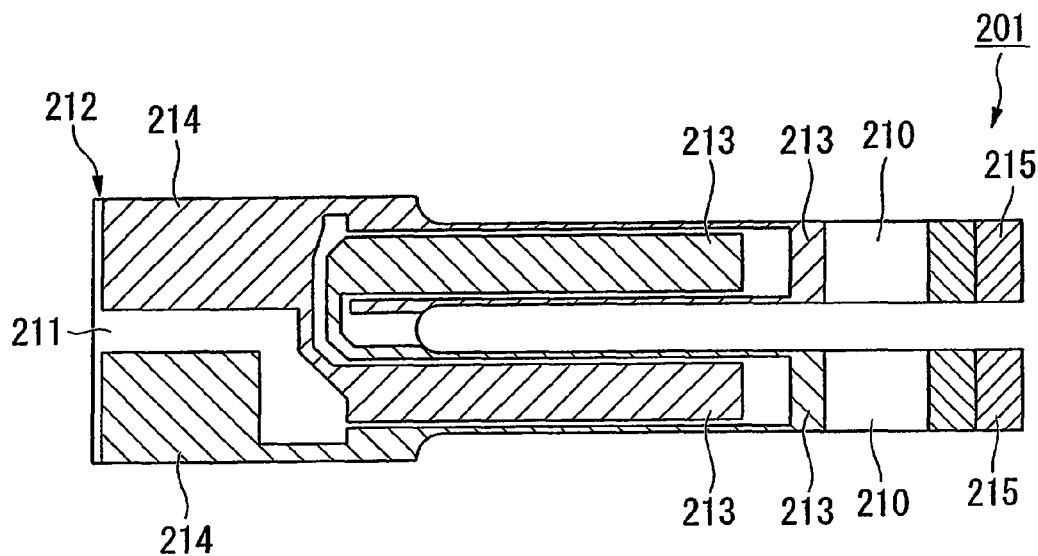
FIG. 23 is a view viewing a piezoelectric vibrating piece of a background art from an upper face.
Figure 24:
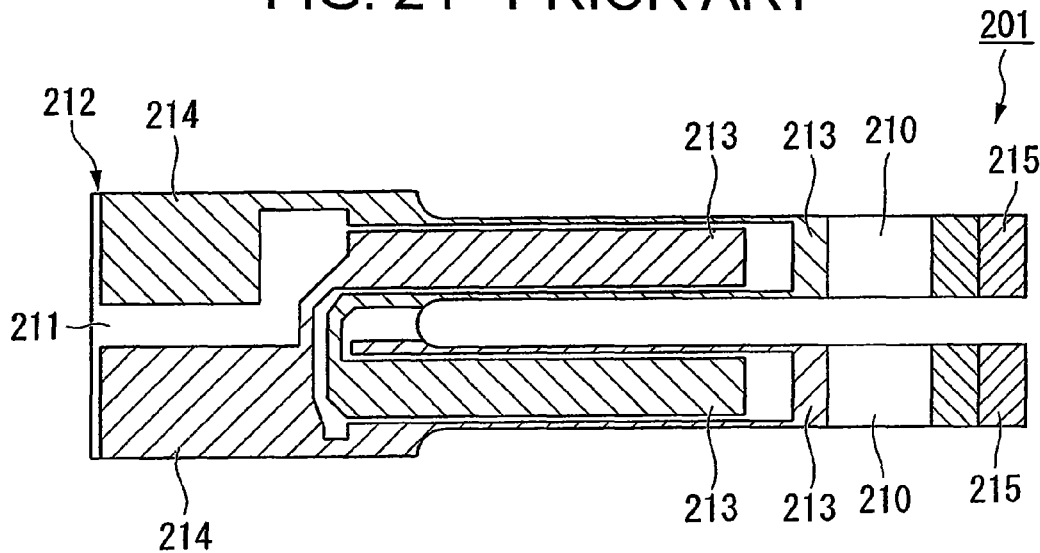
FIG. 24 is a view viewing the piezoelectric vibrating piece of the background art from a lower face.
Figure 25A:
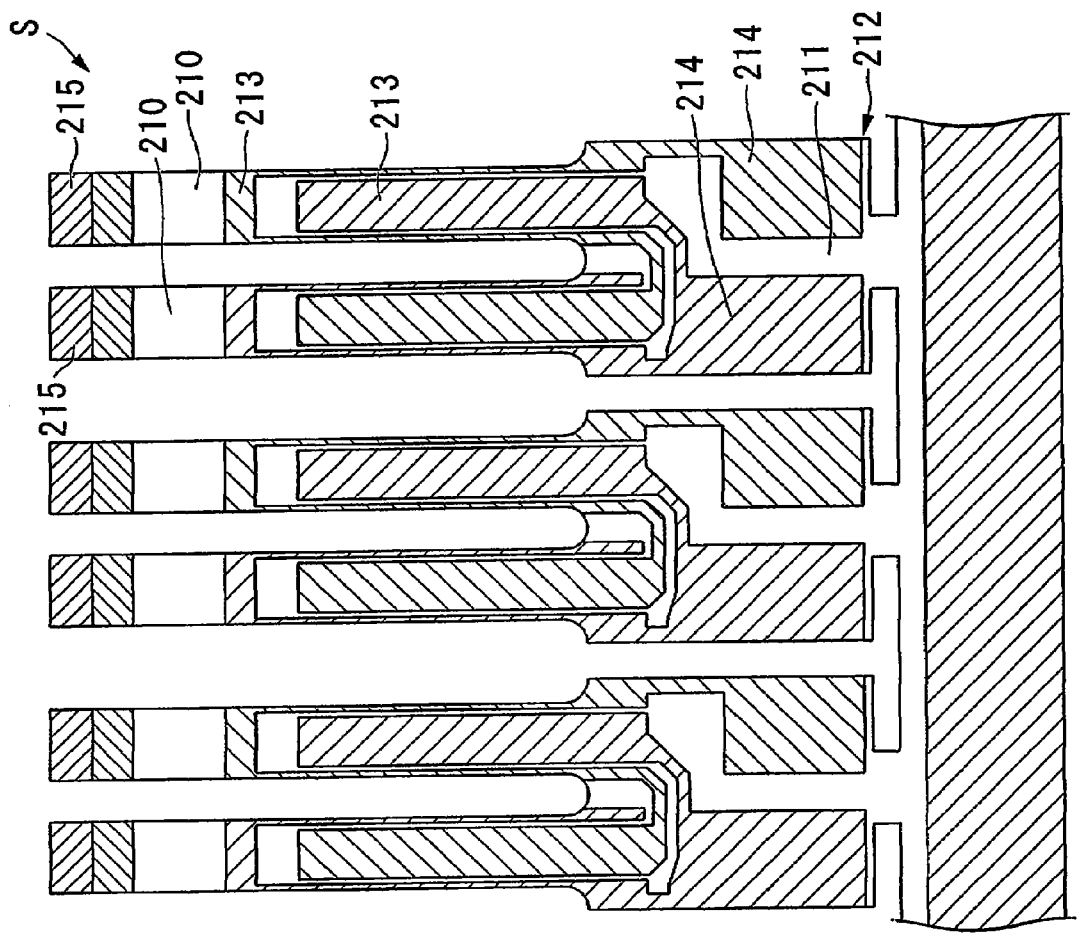
FIGS. 25A and 25B are views showing one step in fabricating the piezoelectric vibrating piece shown in FIG. 23 and FIG. 24.
Figure 25B:
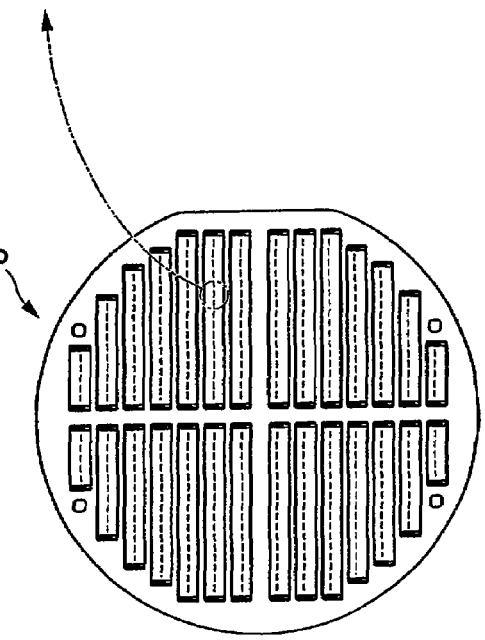

Further, shapes of pair of extended electrodes S2, S3 formed at the frame portion S1 are not limited to mode of the shown in the embodiment but any shapes will do so far as the pair of extended electrodes S2, S3 are electrically connected respectively to the pair of mount electrodes 15, 16 by way of the connecting portion 11a. For example, as shown by FIG. 22, the pair of extended electrodes S2, S3 may be formed to be aligned in a direction substantially orthogonal to the width direction W on the frame portion S1.

What is claimed is:
1. A method of fabricating a plurality of piezoelectric vibrating pieces each including a piezoelectric plate, a pair of exciting electrodes formed on an outer surface of the piezoelectric plate for vibrating the piezoelectric plate when a predetermined drive voltage is applied thereto, and a pair of mount electrodes formed in a state of being aligned in parallel by constituting a predetermined interval along a width direc- tion of the piezoelectric plate and electrically connected respectively to the pair of exciting electrodes at a time utilizing a wafer made of a piezoelectric material, the method comprising:

an outer shape forming step of forming a frame portion and forming to connect the plurality of piezoelectric plates to the frame portion in a cantilever shape by way of a connecting portion in a state of directing base end sides thereof to the frame portion by etching the wafer by a photolithography technology;

an electrode forming step of respectively forming the pairs of exciting electrodes and the pairs of mount electrodes to the plurality of piezoelectric plates and forming a plurality of pairs of extended electrodes such that each extended electrode of the pair of extended electrodes is in electrical contact with a mount electrode of a corresponding pair of the mount electrodes by way of the connecting portion on the frame portion by patterning an electrode film on the wafer, wherein each pair of the mount electrodes is formed between the corresponding pairs of exciting electrodes and extended electrodes along a direction substantially perpendicular to the width direction and is formed with a mount electrode pair length defined along the width direction, and wherein each pair of the extended electrodes is formed with an extended electrode pair length defined along the width direction that is eater than the mount electrode air length;

a frequency adjusting step of adjusting a frequency of the piezoelectric plate while vibrating the piezoelectric plate by applying the drive voltage between the pair of the extended electrodes; and a cutting step of fragmenting the plurality of piezoelectric plates by cutting the connecting portion.

2. The method of fabricating a plurality of piezoelectric vibrating pieces according to claim 1, wherein in the electrode forming step, the pair of extended electrodes are formed in a state of being aligned in parallel by constituting the same predetermined interval along the width direction as that of the corresponding pair of mount electrodes.

3. The method of fabricating a plurality of piezoelectric vibrating pieces according to claim 1, wherein in the electrode forming step, a common extended electrode is formed by respectively electrically connecting a plurality of the extended electrodes on one side.

4. A method of fabricating a plurality of piezoelectric vibrating pieces each including a piezoelectric plate, a pair of exciting electrodes formed on an outer surface of the piezoelectric plate for vibrating the piezoelectric plate when a predetermined drive voltage is applied thereto, and a pair of mount electrodes formed in a state of being aligned in parallel by constituting a predetermined interval along a width direction of the piezoelectric plate and electrically connected respectively to the pair of exciting electrodes at a time utilizing a wafer made of a piezoelectric material the method comprising:

an outer shape forming step of forming a frame portion and forming to connect plurality of piezoelectric slates to the frame portion in a cantilever shape by way of a connecting portion in a state of directing base end sides thereof to the frame portion by etching the wafer by a photolithography technology;

an electrode forming step of respectively forming the pairs of exciting electrodes and the pairs of mount electrodes to the plurality of piezoelectric plates and forming a plurality of pairs of extended electrodes to be electrically connected to respectively to the pairs of mount electrodes by way of the connecting portion on the frame portion by patterning an electrode film on the wafer, wherein the electrode forming step comprises forming a common extended electrode is formed by respectively electrically connecting a plurality of the extended electrodes on one side;

a frequency adjusting step of adjusting the frequency of the piezoelectric plate is adjusted while vibrating simultaneously a plurality of the piezoelectric plates by applying the drive voltage between the common extended electrode and a plurality of the extended electrodes on other side;

a cutting step of fragmenting the plurality of piezoelectric plates by cutting the connecting portion.

5. The method of fabricating a plurality of piezoelectric vibrating pieces according to claim 4, wherein according to the electrode forming step each pair of mount electrodes is formed between the corresponding pairs of exciting electrodes and extended electrodes along a direction substantially perpendicular to the width direction and is formed with a mount electrode pair length defined along the width direction, and wherein each pair of extended electrodes is formed with an extended electrode pair length defined along the width direction that is greater than the mount electrode pair length.

6. The method of fabricating a plurality of piezoelectric vibrating pieces according to claim 4, wherein in the electrode forming step, the pair of extended electrodes are formed in a state of being aligned in parallel by constituting the same predetermined interval along the width direction as that of the corresponding pair of mount electrodes.

* * * * *